United States Patent
York et al.

(10) Patent No.: US 11,495,741 B2
(45) Date of Patent: Nov. 8, 2022

(54) BISMUTH ANTIMONY ALLOYS FOR USE AS TOPOLOGICAL INSULATORS

(71) Applicant: Western Digital Technologies, Inc., San Jose, CA (US)

(72) Inventors: Brian R. York, San Jose, CA (US); Cherngye Hwang, San Jose, CA (US); Alan Spool, San Jose, CA (US); Michael Gribelyuk, San Jose, CA (US); Quang Le, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 175 days.

(21) Appl. No.: 16/917,334

(22) Filed: Jun. 30, 2020

(65) Prior Publication Data

US 2021/0408370 A1 Dec. 30, 2021

(51) Int. Cl.
| | |
|---|---|
| *H01L 43/10* | (2006.01) |
| *H01L 27/22* | (2006.01) |
| *H03B 15/00* | (2006.01) |
| *H01L 43/04* | (2006.01) |
| *H01L 43/06* | (2006.01) |

(52) U.S. Cl.
CPC ............ *H01L 43/10* (2013.01); *H01L 27/222* (2013.01); *H01L 43/04* (2013.01); *H01L 43/06* (2013.01); *H03B 15/006* (2013.01)

(58) Field of Classification Search
CPC ....... H01L 43/10; H01L 27/222; H01L 43/04; H01L 43/06; H03B 15/006; H01F 10/329
See application file for complete search history.

(56) References Cited

U.S. PATENT DOCUMENTS

| 5,751,521 A | 5/1998 | Gill |
|---|---|---|
| 6,657,823 B2 | 12/2003 | Kawato |

(Continued)

FOREIGN PATENT DOCUMENTS

| JP | 4934582 B2 | 5/2012 |
|---|---|---|
| JP | 2021057357 A | 4/2021 |

(Continued)

OTHER PUBLICATIONS

James Ralph Teague, X-ray and Mössbauer spectroscopy studies of the silicon antimony and bismuth-antimony alloys, 1971, Doctoral Dissertations, University of Missouri-Rolla (Year: 1971).*

(Continued)

*Primary Examiner* — Shih Tsun A Chou
(74) *Attorney, Agent, or Firm* — Patterson & Sheridan, LLP; Steven H. VerSteeg

(57) ABSTRACT

A SOT device includes a bismuth antimony dopant element (BiSbE) alloy layer over a substrate. The BiSbE alloy layer is used as a topological insulator. The BiSbE alloy layer includes bismuth, antimony, AND a dopant element. The dopant element is a non-metallic dopant element, a metallic dopant element, and combinations thereof. Examples of metallic dopant elements include Ni, Co, Fe, CoFe, NiFe, NiCo, NiCu, CoCu, NiAg, CuAg, Cu, Al, Zn, Ag, Ga, In, or combinations thereof. Examples of non-metallic dopant elements include Si, P, Ge, or combinations thereof. The BiSbE alloy layer can include a plurality of BiSb lamellae layers and one or more dopant element lamellae layers. The BiSbE alloy layer has a (012) orientation.

24 Claims, 17 Drawing Sheets

(56) References Cited

U.S. PATENT DOCUMENTS

| | | | |
|---|---|---|---|
| 6,667,861 | B2 | 12/2003 | Gill |
| 6,680,828 | B2 | 1/2004 | Gill |
| 6,906,898 | B2 | 6/2005 | Kawato |
| 7,016,160 | B2 | 3/2006 | Mao et al. |
| 7,242,556 | B2 | 7/2007 | Gill |
| 7,298,595 | B2 | 11/2007 | Gill |
| 7,436,632 | B2 | 10/2008 | Li et al. |
| 7,643,255 | B2 | 1/2010 | Gill et al. |
| 7,697,242 | B2 | 4/2010 | Gill |
| 7,881,018 | B2 | 2/2011 | Gill et al. |
| 8,125,746 | B2 | 2/2012 | Dimitrov et al. |
| 8,174,799 | B2 | 5/2012 | Hoshiya et al. |
| 8,223,464 | B2 | 7/2012 | Yasui et al. |
| 8,553,346 | B2 | 10/2013 | Braganca et al. |
| 8,570,677 | B2 | 10/2013 | Braganca et al. |
| 8,570,689 | B2 | 10/2013 | Sato et al. |
| 8,654,465 | B2 | 2/2014 | Braganca et al. |
| 9,472,216 | B1 | 10/2016 | Mauri et al. |
| 9,806,710 | B2 | 10/2017 | Flatte |
| 9,929,210 | B2 | 3/2018 | Lai et al. |
| 9,947,347 | B1 | 4/2018 | Van Der Heijden et al. |
| 10,014,012 | B1 | 7/2018 | Song et al. |
| 10,127,933 | B2 | 11/2018 | Batra et al. |
| 10,210,888 | B1 | 2/2019 | Li et al. |
| 10,483,457 | B1 | 11/2019 | Lee et al. |
| 10,490,731 | B2 | 11/2019 | Sasaki et al. |
| 10,720,570 | B2 | 7/2020 | Le et al. |
| 10,839,831 | B1 | 11/2020 | Nguyen et al. |
| 10,991,390 | B2 | 4/2021 | Kobayashi |
| 11,094,338 | B1 | 8/2021 | Hwang et al. |
| 11,100,946 | B1 | 8/2021 | Le et al. |
| 11,222,656 | B1 | 1/2022 | Le et al. |
| 2014/0226239 | A1 | 8/2014 | Mihajlovic et al. |
| 2014/0254252 | A1 | 9/2014 | Guo |
| 2015/0041934 | A1* | 2/2015 | Khvalkovskiy ..... G11C 11/1675 257/421 |
| 2015/0287426 | A1 | 10/2015 | Mihajlovic et al. |
| 2017/0077392 | A1 | 3/2017 | Han et al. |
| 2017/0098545 | A1 | 4/2017 | Woodruff |
| 2017/0221506 | A1 | 8/2017 | Tan et al. |
| 2017/0288666 | A1* | 10/2017 | Flatte ................. H01L 43/06 |
| 2018/0166500 | A1* | 6/2018 | Wang ................. H01L 43/10 |
| 2018/0358543 | A1 | 12/2018 | Le et al. |
| 2018/0366172 | A1 | 12/2018 | Wang et al. |
| 2019/0037703 | A1 | 1/2019 | Wang et al. |
| 2019/0058113 | A1 | 2/2019 | Ramaswamy et al. |
| 2019/0392881 | A1 | 12/2019 | Rakshit et al. |
| 2020/0279992 | A1* | 9/2020 | Pham ................. H01L 43/10 |
| 2021/0056988 | A1 | 2/2021 | Chen et al. |
| 2021/0249038 | A1* | 8/2021 | Le ..................... H01L 43/02 |
| 2021/0336127 | A1 | 10/2021 | Le et al. |
| 2022/0005498 | A1 | 1/2022 | Le et al. |
| 2022/0013138 | A1 | 1/2022 | Hwang et al. |

FOREIGN PATENT DOCUMENTS

| | | |
|---|---|---|
| WO | 2019054484 A1 | 3/2019 |
| WO | 2019125388 A1 | 6/2019 |
| WO | 2019159885 A1 | 8/2019 |

OTHER PUBLICATIONS

Walker et al., Composition-dependent structural transition in epitaxial Bi1-xSbx thin films on Si(111), Physical Review Materials 3, 064201 (2019) (Year: 2019).*

Berry et al. "Melting at dislocations and grain boundaries: A phase field crystal study," Physical Review, vol. B 77, No. 224114, 2008, pp. 224114-1-224114-5, DOI: 10.1103/PhysRevB.77.224114.

Buffat et al. "Size effect on the melting temperature of gold particles," Physical Review A, vol. 13, No. 6, Jun. 1976, pp. 2287-2298.

Cantwell et al. "Grain boundary complexions," ScienceDirect, Acta Materialia, vol. 62, No. 152, 2014, pp. 1-48, http://dx.doi.org/10 1016/j.actamat.2013.07.037.

Eustathopoulos "Wetting by Liquid Metals-Application in Materials Processing: The Contribution of the Grenoble Group," Metals, 2015, vol. 5, No. 1, pp. 350-370, doi:10.3390/met5010350.

Frolov et al. "Structural phase transformations in metallic grain boundaries," Nature Communications, 2013, vol. 4, No. 1899, pp. 1-7, DOI: 10.1038/ncomms2919.

Kogtenkova et al. "Grain Boundary Complexions and Phase Transformations in Al- and Cu-Based Alloys," Metals, 2019, vol. 9, No. 1, doi:10.3390/met9010010, 24 pages.

Tanaka et al. "Thermodynamic Evaluation of Nano-Particle Binary Alloy Phase Diagrams," 2001, Zeitschrift für Metallkunde, vol. 92, No. 11, pp. 1236-1241, http: //hdl.handle.net/11094/26514.

Walker et al. "Composition-dependent structural transition in epitaxial Bi1-xSbx thin films on Si (111)," Physical Review Materials, vol. 3, 064201, Jun. 7, 2019, 8 pages.

Roschewsky, Niklas et al.; "Spin-orbit Torque and Nernst Effect in Bi—Sb/Co Heterostructures", American Physical Society, Physical Review, B 99; https://journals.aps.org/prb/abstract/10.1103/PhysRevB.99.195103, 2019 (5 pages).

Roschewsky, Niklas et al., "Spin-Orbit Torque and Nernst Effect in BiSb/ Co Heterostructures", Center for Energy Efficient Electronics Science, https://e3s-center.berkeley.edu/wp-content/uploads/2018/11/43Theme-4_Roschewsky_2018E3Sretreat.pdf, 2018 (12 pages).

Chi, Zhendong et al.; "The Spin Hall Effect of Bi—Sb Alloys Driven by Thermally Excited Dirac-like Electronics", ArXiv: 1910, https://arxiv.org/pdf/1910.12433.pdf (40 pages).

Shirokura, Takanori et al.; "Origin of the Giant Spin Hall Effect in BiSb Topological Insulator", ArXiv:1810; https://arxiv.org/ftp/arxiv/papers/1810/1810.10840.pdf (27 pages).

Qiming, Shao; "Spin-Orbit Torques in Topological Insultators", UCLA Electronic Theses and Dissertations; https://escholarship.org/content/qt3ds9792s/qt3ds9792s.pdf?t=nys1b5&nosplash=32ac004cc5750a361e60ece735dd2752; 2015 (76 pages).

Khang, Nguyen Huynh Duy et al.; "A Colossal Breakthrough for Topological Spintronics: BiSb Expands the Potential of Topological Insulators for Ultra-Low-Power Electronic Devices" Nature Materials, https://www.titech.ac.jp/english/news/2018/042001.html, 2018 (4 pages).

Yao, Kenichiro et al.; "Influence of Crystal Orientation and Surface Termination on the Growth of BiSb thin films on GaAs Substrates", Accepted Manuscript, Journal of Crystal Growth, https://www.sciencedirect.com/science/article/pii/S002202481930065X.

Khang, Nguyen Huynh Duy et al.; "A Conductive Topological Insultator with Large Spin Hall Effect for Ultralow Power Spin-Orbit Torque Switching", Nature Materials, vol. 17, http://www.nature.com/naturematerials, Sep. 2018 (7 pages).

International Search Report and the Written Opinion for International Application No. PCT/US2020/066902 dated Apr. 18, 2021, 12 pages.

Fan et al. "Magnetization switching through giant spin-orbit torque in a magnetically doped topological insulator heterostructure," Nature Materials, vol. 13, Apr. 28, 2014, pp. 669-704, <<https://doi.org/10.1038/nmat3973>>.

International Search Report and the Written Opinion for International Application No. PCT/US2020/065156 dated Mar. 14, 2021, 13 pages.

U.S. Appl. No. 17/401,856, filed Aug. 13, 2021.
U.S. Appl. No. 17/405,954, filed Aug. 18, 2021.

"A colossal breakthrough for topological spintronics," Tokyo Institute of Technology, Jul. 31, 2018, 4 pages, <https://www.titech.ac.jp/english/news/2018/042001.html>.

Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011.2169946.

International Search Report and the Written Opinion for International Application No. PCT/US2021/033197 dated Jul. 12, 2021, 9 pages.

International Search Report and the Written Opinion for International Application No. PCT/US2021/033912 dated Jul. 25, 2021, 9 pages.

(56) References Cited

OTHER PUBLICATIONS

Kotb et al. "Study of spin transfer torque (STT) and spin orbit torque (SOT) magnetic tunnel junctions (MTJs) at advanced CMOS technology nodes," Electrical and Electronics Engineering: An International Journal, (ELELIJ) vol. 6, No. 1, Feb. 2017, pp. 1-9, 10.14810/elelij.2017.6101.

Lau et al. "Spin-orbit torque switching without an external field using interlayer exchange coupling," Nature Nanotechnology, vol. 11, Sep. 2016, pp. 758-762, <https://doi.org/10.1038/nnano.2016.84>.

Liu "Spin-orbit Torque Driven Magnetization Switching for Nonvolatile Memory and Beyond," Carnegie Mellon University, May 2020, Thesis, 157 pages, <https://doi.org/10.1184/R1/11933571.v1>, <https://kilthub.cmu.edu/articles/Spinorbit_Torque_Driven_Magnetization_Switching_for_Nonvolatile_Memory_and_Beyond/11933571/files/21908046.pdf>.

Yuan et al. "Readback Resolution of Differential Dual CPP Spin Valve Reader," IEEE Transactions on Magnetics, vol. 46, No. 6, Jun. 2010, pp. 1667-1670, 10.1109/TMAG.2010.2045106.

\* cited by examiner

BISMUTH ANTIMONY ALLOYS FOR USE AS TOPOLOGICAL INSULATORS

BACKGROUND OF THE DISCLOSURE

Field of the Disclosure

Embodiments of the present disclosure generally relate to bismuth antimony (BiSb) alloys with (012) orientation for use as topological insulators.

Description of the Related Art

BiSb with (012) orientation is a narrow gap topological insulator with both giant spin Hall effect and high electrical conductivity. BiSb is a material that has been proposed in various spin-orbit torque (SOT) applications, such as for a spin Hall layer for magnetoresistive random access memory (MRAM) devices and energy-assisted magnetic recording (EAMR) write heads.

However, BiSb materials have yet to be adopted in commercial SOT applications due to several obstacles. For example, BiSb materials have low melting points, large grain sizes, significant Sb migration issues upon thermal annealing due to its film roughness, difficulty maintaining a (012) orientation for maximum spin Hall effect and are generally soft and easily damaged by ion milling.

Therefore, there is a need for an improved SOT device and process of forming a BiSb layer with (012) orientation.

SUMMARY OF THE DISCLOSURE

Embodiments of the present disclosure generally relate to bismuth antimony (BiSb) alloys with (012) orientation for use as topological insulators in spin-orbit torque (SOT) devices.

In one embodiment, a SOT device includes a bismuth antimony dopant element (BiSbE) alloy layer over a substrate. The BiSbE alloy layer includes bismuth, antimony, and a dopant element. The dopant element is a non-metallic dopant element, a metallic dopant element, or combinations thereof. Examples of metallic dopant elements include Ni, Co Fe, CoFe, NiFe, NiCo, NiCu, CoCu, NiAg, CuAg, Cu, Al, Zn, Ag, Ga, In, or combinations thereof. Examples of non-metallic dopant elements include Si, P, Ge, or combinations thereof. The BiSbE alloy layer has a (012) orientation.

In another embodiment, a SOT device includes a bismuth antimony dopant element (BiSbE) alloy layer over a substrate. The BiSbE alloy layer includes a plurality of BiSb lamellae layers and one or more dopant element lamellae layers. Each of the dopant element lamellae layers includes a non-metallic dopant element, a metallic dopant element, or combinations thereof. Examples of metallic dopant elements include Ni, Co Fe, CoFe, NiFe, NiCo, NiCu, CoCu, NiAg, CuAg, Cu, Al, Zn, Ag, Ga, In, or combinations thereof. Examples of non-metallic dopant elements include Si, P, Ge, or combinations thereof. The BiSbE alloy layer has a (012) orientation.

In still another embodiment, a magnetoresistive random access memory (MRAM) device includes a bismuth antimony dopant element (BiSbE) alloy layer. The BiSbE alloy layer includes bismuth, antimony, and a metallic dopant element. The metallic dopant element is Ni, Co Fe, CoFe, NiFe, NiCo, NiCu, CoCu, NiAg, CuAg, Cu, Al, Zn, Ag, Ga, In, or combinations thereof. The BiSbE alloy layer has a (012) orientation. The MRAM device further includes a perpendicular magnetic anisotropy (PMA) ferromagnetic layer.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
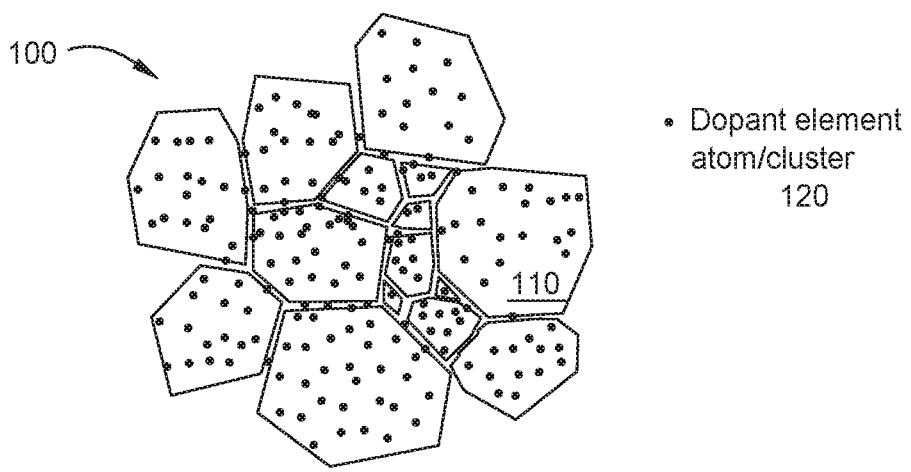
FIGS. 1A-1C are schematic illustration of a BiSb alloy layer comprising dopant element(s).

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s). Usage in the Summary of the Disclosure or in the Detailed Description of the term "comprising" shall mean comprising, consisting essentially, and/or consisting of.

Embodiments of the present disclosure generally relate to bismuth antimony (BiSb) alloys with (012) orientation for use as topological insulators. The BiSb alloys comprise bismuth, antimony, and a dopant element (E) and are herein referred to as BiSbE alloys. The dopant element comprises a non-metallic dopant element, a metallic dopant element, or combinations thereof.

BiSbE alloy layers with (012) orientation have a large spin Hall angle effect and high electrical conductivity. Certain embodiments of the BiSbE alloy layers have reduced grain size and lower interfacial roughness in comparison to a BiSb material without dopant elements. Certain embodiments of the BiSbE alloy layers comprising a metallic dopant element have an increased melting temperature and allow higher annealing temperatures to be used while maintaining high (012) texture in comparison to a BiSb material without dopant elements. BiSbE alloy layers having (012) orientation can be used to form spin-orbit torque (SOT) devices, such as spin Hall electrode layers in MRAM devices or in an EAMR write heads. For example, BiSbE alloy layers are implemented into the manufacturing of SOT devices which are annealed to set magnetic directions of perpendicular magnetic anisotropy (PMA) ferromagnetic layers.

A prior BiSb layer with (012) orientation has a large spin Hall angle effect and high electrical conductivity. TABLE 1 shows one example of the properties of a BiSb layer with (012) orientation in comparison to beta-tantalum and to a BiSb layer with (001) orientation. A BiSb layer with (012) orientation has similar electrical conductivity and a much larger spin Hall angle than beta-tantalum (Beta-Ta) or a BiSb layer with (001) orientation. Therefore, the relative power required to produce a spin Hall effect is lower for BiSb (012) in comparison to Beta-Ta or BiSb (001).

TABLE 1

| | Spin Hall angle $\theta_{SH}$ | conductivity $\sigma$ ($10^6$ $\Omega^{-1}m^{-1}$) | Power (relative) |
|---|---|---|---|
| Beta-Ta | −0.15 | 0.52 | 1 |
| BiSb (001) | 11 | 0.25 | $3.9 \times 10^{-04}$ |
| BiSb (012) | 52 | 0.25 | $1.7 \times 10^{-05}$ |

Prior BiSb materials with Sb content from about 5 atomic % to about 22 atomic % have melting points from about 270° C. to about 300° C. depending on the Sb content. During annealing, prior BiSb materials experience high levels of undesirable Sb migration due to the high roughness of the BiSb materials.

The present BiSbE alloy layers according to various embodiments disclosed herein have a high degree of (012) orientation, a large spin Hall angle effect, a low interfacial roughness, and a high electrical conductivity comparable to BiSb (012) materials without dopant elements. In certain embodiments, the BiSbE alloy layers with metallic dopant elements provide higher annealing temperatures to be used in comparison to BiSb materials without dopant elements.

In certain embodiments, a BiSbE alloy layer includes a non-metallic dopant element comprising Si, P, Ge, other suitable non-metallic dopant elements, or combinations thereof. In certain embodiments, a BiSbE alloy layer includes a metallic dopant element comprising Ni, Co, Fe, CoFe, NiFe, NiCo, NiCu, CoCu, NiAg, CuAg, Cu, Al, Zn, Ag, Ga, In, other suitable metallic dopant elements, or combinations thereof.

In certain embodiments, a BiSbE alloy layer comprises $Bi_{1-x}Sb_xE$ wherein x is 0.05<x<0.22 and comprises the dopant element (E) from about 0.5 atomic % to about 15 atomic %.

Without being bound by theory unless specifically set forth in the claims, it is believed that the dopant element of the BiSbE alloy layer has a low solubility inside the BiSb lattice while maintaining the topological insulator property and the (012) orientation of the BiSb material. It is believed that a portion of the dopant element goes into the BiSb lattice after deposition. For example, in certain embodiments for a dopant element deposited at room temperature, a portion of the dopant element goes into the BiSb lattice and contracts the a-axis by about 0.5% and expands the c-axis from about 0.5 to about 1.0%. It is believed that a portion of the dopant element can act as a grain boundary segregant refining the structure of the BiSb grains or go to the BiSbE interfacial regions forming part of a seed layer or part of a cap layer.

FIG. 1A is a schematic illustration of a top down planar view of a BiSbE alloy layer 100 at deposition. The BiSbE alloy layer 100 comprises a plurality of BiSb lamellae layers 110 and one or more dopant element lamellae layers at deposition. The BiSbE alloy layer 100 comprises grains of BiSb and a layer of atoms/clusters 120 of dopant element(s) deposited uniformly over the grains of BiSb. It is believed that the atoms/clusters 120 of dopant element lamella layer forms uniformly over the BiSb lamella layer 110.

Figure 1B:
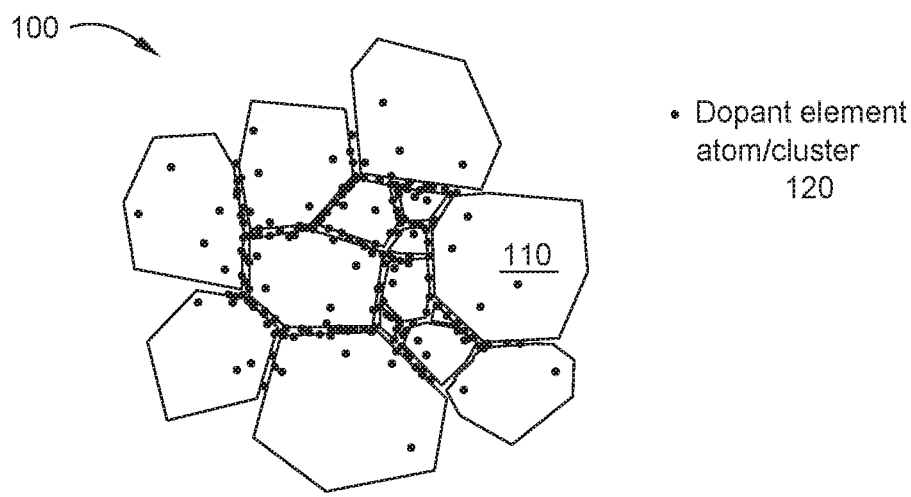

FIG. 1B is a schematic illustration of a top down planar view of the BiSbE alloy layer 100 after post annealing. It is believed that the atoms/clusters 120 of dopant element(s)

have been redistributed to the grain boundaries of the BiSbE lamella layer 110. Some portion of the atoms/clusters 120 of dopant element is retained in the BiSb lattice while another portion of the atoms/clusters 120 of dopant element goes to the grain boundaries of the BiSb and to the BiSbE interfaces. The portion of the dopant element that goes to the grain boundaries of the BiSb becomes a segregant which reduces the grain size of the BiSb and reduces the interfacial roughness of the BiSbE alloy layer 100. In certain embodiments, the portion of the dopant element comprising metallic dopant elements that is retained in the BiSb lattice increases the melting point of the BiSbE alloy layer in comparison to a BiSb layer without dopant elements. The portion of the dopant element that is retained in the BiSb lattice allows the annealing temperature of the BiSbE alloy layer to be increased due to alloying (lattice hardening) and grain boundary segregation (grain size hardening) effects which pin and restrict the grain boundaries from moving at elevated temperatures. The BiSbE alloy layer is able to withstand an anneal, such as an anneal of about 280° C. or above for three hours or more.

Figure 1C:
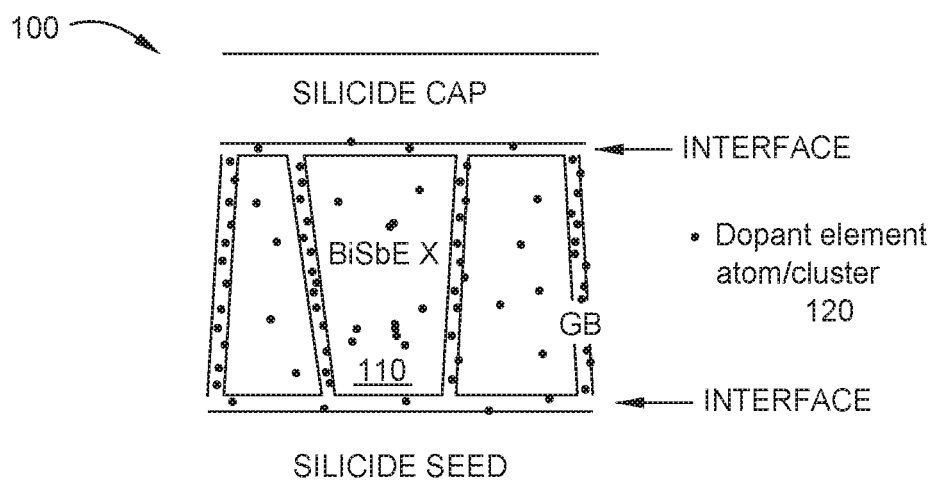

FIG. 1C is a schematic illustration of a cross-sectional layer view of the BiSbE alloy layer 100 after post annealing. It is believed that the atoms/clusters 120 of dopant element(s) have been redistributed to the grain boundaries of the BiSbE lamella layer 110 and to seed or cap layer interfaces, such as a silicide seed or silicide cap layer interfaces. The portion of the dopant element that goes to the grain boundaries becomes the segregant which reduces or modifies the grain size and lattice parameters of the grains 110 of BiSb and reduces the interfacial roughness of the BiSbE alloy layer 100.

In certain embodiments, the interfacial roughness of the BiSbE alloy layer with a silicide seed layer and with a silicide cap layer is about 14 Å or less. In certain embodiments, interfacial roughness of the BiSbE alloy layer with a silicide seed layer and a silicide cap layer is reduced by about from about 3 Å to about 5 Å in comparison to a BiSb material without dopant elements. The use of a metal interlayers between the BiSbE alloy layer and the silicide seed layer and between the BiSbE alloy layer and the silicide cap layer further reduces the interfacial roughness for the BiSbE alloy layer.

The (012) texture is enhanced with a BiSbE alloy layer in comparison to a BiSb without dopant elements. For example, in certain embodiments, the (012) texture of a BiSbE alloy stack of a silicide seed layer, a metal interlayer, a BiSbE alloy layer, a metal interlayer, a silicide cap layer has a rocking curve with widths less than 11 degrees, such as from about 7 to about 10 degrees. In comparison, the (012) texture of a BiSb stack without dopant elements of a stack of a silicide seed layer, a metal interlayer, a BiSb layer, a metal interlayer, a silicide cap layer has a rocking curve with widths of about 10 degrees or more and with a dual (001) and (012) texture.

In certain embodiments, the BiSbE alloy layer is formed to a thickness from about 20 Å to about 200 Å, such as from about 50 Å to about 150 Å. In other embodiments, the BiSbE alloy layer is formed to any suitable thickness. In certain embodiments, the BiSbE alloy layer is deposited by physical vapor deposition (PVD), such as sputtering, molecular beam epitaxy, ion beam deposition, other suitable PVD processes, and combinations thereof. In certain embodiments, a SOT device includes a BiSbE alloy layer formed over any suitable layer and with any suitable layer formed over the BiSbE alloy layer.

In certain embodiments, the BiSbE alloy layer comprises a multi-layer laminate of a plurality of BiSb lamellae layers and one or more dopant element lamellae layers. The BiSbE alloy multi-layer laminate provides placement of the dopant element lamella layer at specific regions of the BiSbE alloy layer to increase nucleation and growth of (012) orientation, to reduce interfacial roughness, and/or to reduce grain size.

In one embodiment, the BiSbE alloy layer comprises 2 to 10 BiSb lamellae layers with each BiSb lamella layer having a thickness from about 5 Å to about 30 Å and comprises 1 to 9 dopant element lamellae layers with each dopant element lamella layer having a thickness from about 0.1 Å to about 4 Å. One or more dopant element lamellae layers are interspersed between the BiSb lamellae layers. In other embodiments, the BiSbE alloy layer comprises any suitable number of BiSb lamellae layers with each BiSb lamella layer formed to any suitable thickness and comprises any suitable number of dopant element lamellae layers with each dopant element lamella layer formed to any suitable thickness.

Figure 2A:
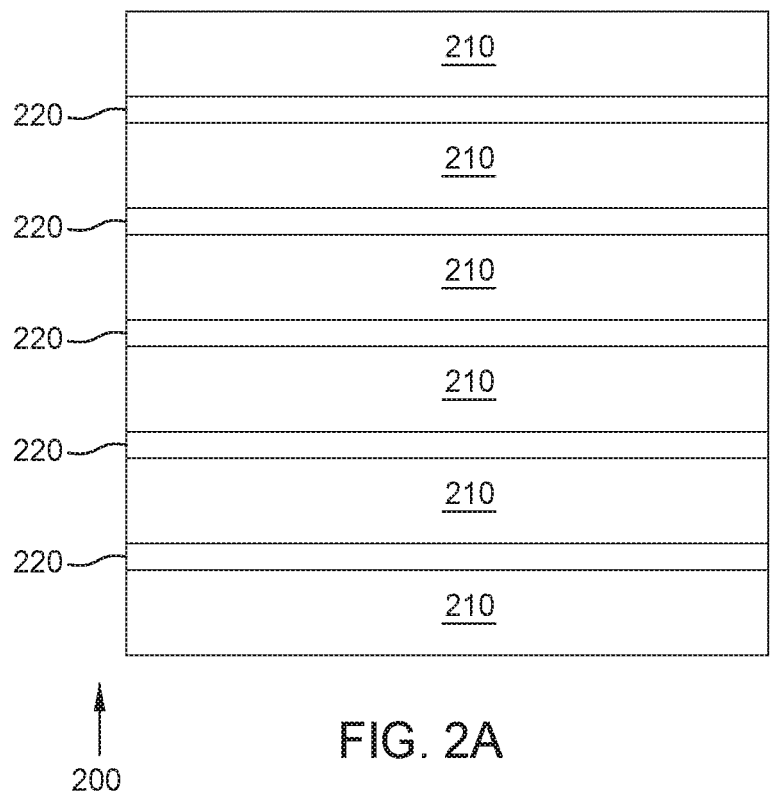
FIGS. 2A-2B are schematic illustrations of a BiSbE alloy layer comprising multiple BiSb lamellae layers and comprising dopant element lamellae layers between each of the BiSb lamellae layers.
Figure 2B:
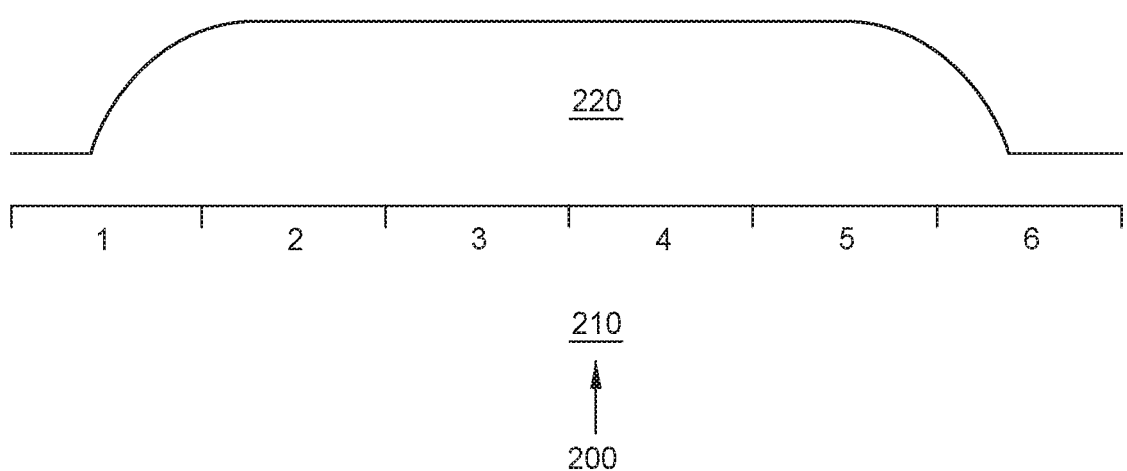

FIG. 2A is a schematic illustration of deposition of a BiSbE alloy layer 200 comprising six BiSb lamellae layers 210 and five dopant element lamellae layers 220. A dopant element lamella layer 220 has been deposited between each of the BiSb lamellae layers 210. The dopant element lamellae layers 220 have been deposited throughout the BiSbE alloy layer 200. FIG. 2B is a schematic illustration of the distribution of the dopant element within the BiSb lamellae layers 210 of the BiSbE alloy layer 200 at deposition or after annealing. The dopant element is distributed into each of the BiSb lamellae layers 210.

Figure 2C:
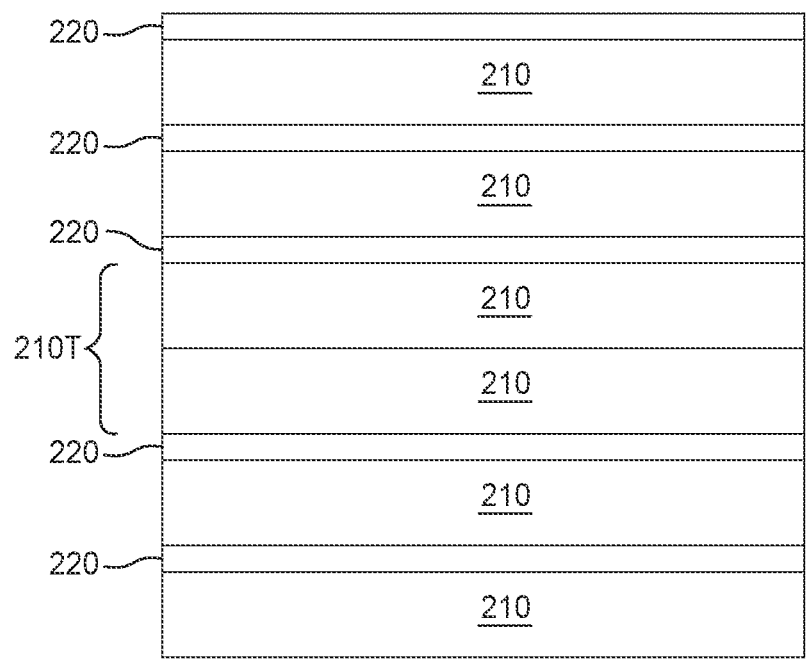
FIGS. 2C-2D are schematic illustrations of a BiSbE alloy layer comprising multiple BiSb lamellae layers and comprising dopant element lamellae layers at the bottom edge and the top edge of the BiSbE alloy layer.
Figure 2D:
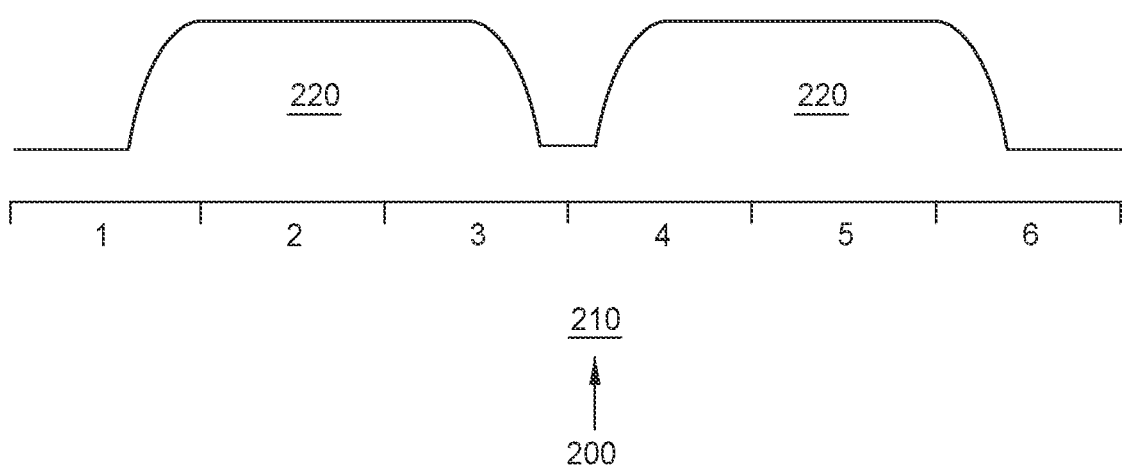

FIG. 2C is a schematic illustration of deposition of a BiSbE alloy layer 200 comprising six BiSb lamellae layers 210 and at least four dopant element lamellae layers 220. The BiSbE alloy layer 200 can also be viewed as two thin BiSb lamellae layers 210 at the bottom edge, two thin BiSb lamellae layers 210 at the top edge, and a thick BiSb lamella layer 210T at the center with dopant element lamellae layers 220 therebetween. The dopant element lamellae layers 220 have been deposited at the bottom edge and the top edge of the BiSbE alloy layer 200 but not at the center of the BiSbE alloy layer 200. FIG. 2D is a schematic illustration of the distribution of the dopant element within the BiSb lamellae layers 210 of the BiSbE alloy layer 200 at deposition or after annealing. The dopant element is distributed at the bottom edge and the top edge of the BiSbE alloy layer 200.

Figure 2E:
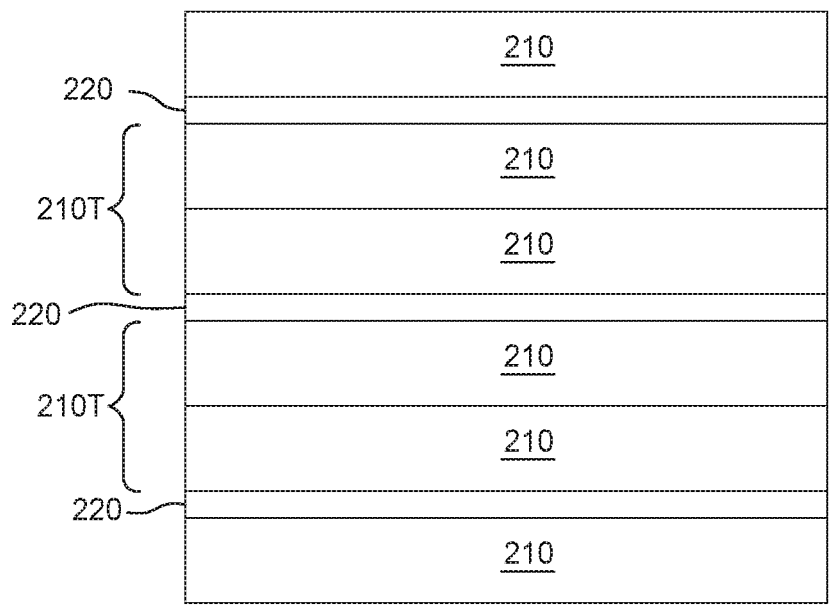
FIGS. 2E-2F are schematic illustrations of a BiSbE alloy layer comprising multiple BiSb lamellae layers and comprising dopant element lamellae layers at the bottom edge, the center, and the top edge of the BiSbE alloy layer.
Figure 2F:
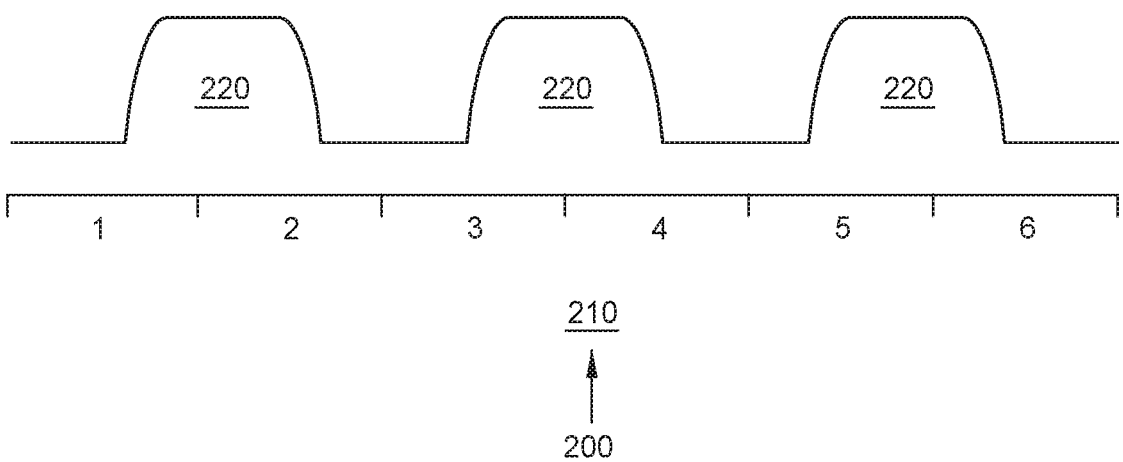

FIG. 2E is a schematic illustration of deposition of a BiSbE alloy layer 200 comprising six BiSb lamellae layers 210 and three dopant element lamellae layers 220. The BiSbE alloy layer 200 can also be viewed as one thin BiSb lamella layer 210 at the bottom edge, one thin BiSb lamella layer 210 at the top edge, and two thick BiSb lamellae layers 210T at the center with dopant element lamellae layers 220 therebetween. The dopant element lamellae layers 220 have been deposited every other BiSb lamella layer 210. The dopant element lamellae layers 220 have been deposited at the bottom edge, the center, and the top edge of the BiSbE alloy layer 200. FIG. 2F is a schematic illustration of the distribution of the dopant element within the BiSb lamellae layers 210 of the BiSbE alloy layer 200 at deposition or after annealing. The dopant element is distributed at the bottom edge, the center, and the top edge of the BiSbE alloy layer 200.

Figure 2G:
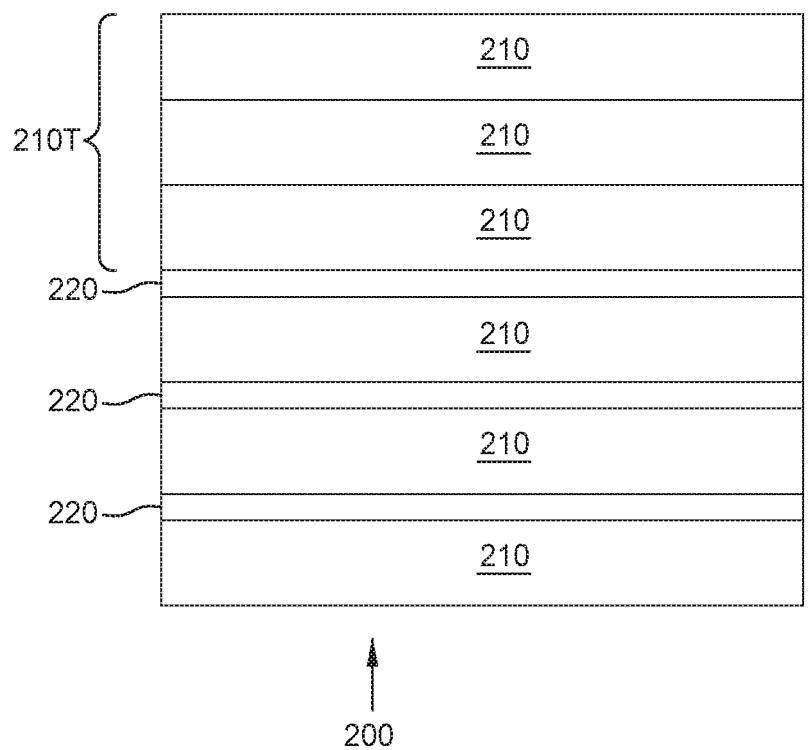
FIGS. 2G-2H are schematic illustrations of a BiSbE alloy layer comprising multiple BiSb lamellae layers and comprising dopant element lamellae layers at the bottom edge of the BiSbE alloy layer.
Figure 2H:
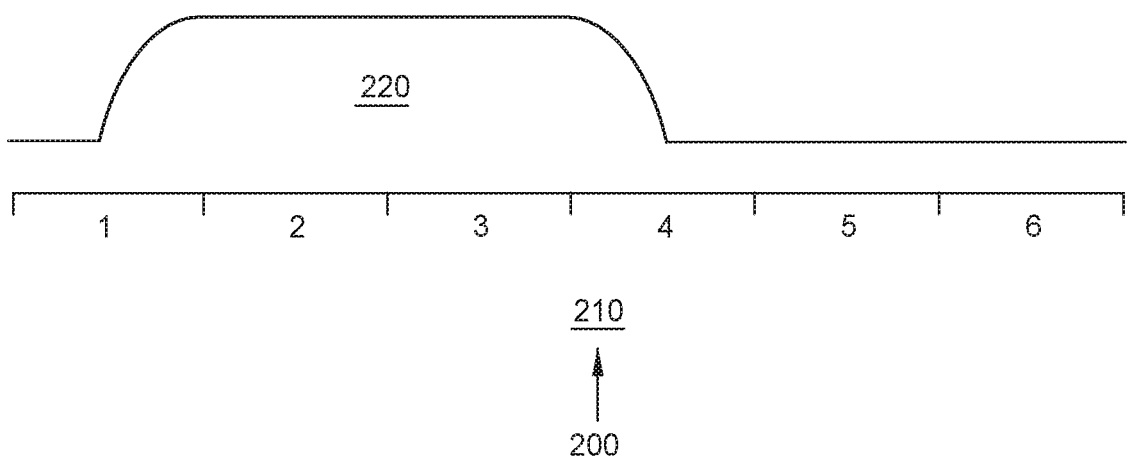

FIG. 2G is a schematic illustration of deposition of a BiSbE alloy layer 200 comprising six BiSb lamellae layers 210 and three dopant element lamellae layers 220. The BiSbE alloy layer 200 can be viewed as three thin BiSb lamellae layers 210 at the bottom edge and one thick BiSb lamella layer 210T at top edge with dopant element lamellae layers 220 therebetween. The dopant element lamellae layers 220 have been deposited at the bottom edge but not at the top edge of the BiSbE alloy layer 200. FIG. 2H is a schematic illustration of the distribution of the dopant element within the BiSb lamellae layers 210 of the BiSbE alloy layer 200 at deposition or after annealing. The dopant element is distributed at the bottom edge of the BiSbE alloy layer 200.

Figure 13A:
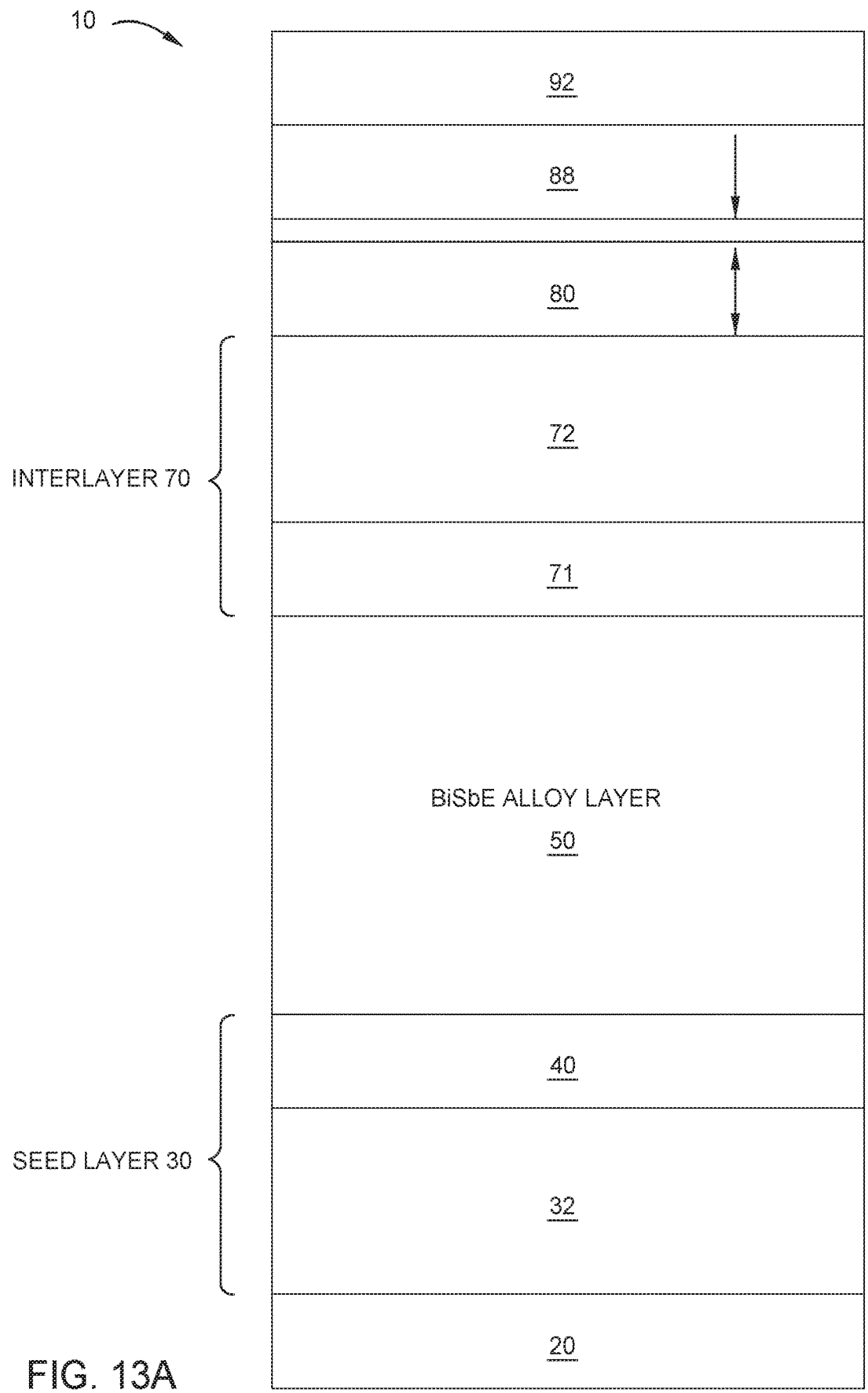
FIG. 13A is a schematic cross-sectional view of certain embodiments of a SOT device having a BiSbE alloy layer with (012) orientation forming a SOT-based magnetoresistive random access memory (MRAM) device.

FIG. 13A is a schematic cross-sectional view of certain embodiments of a SOT device 10 having a BiSbE alloy layer 50 with (012) orientation forming a SOT-based magnetoresistive random access memory (MRAM) device.

The BiSbE alloy layer 50 with (012) orientation is formed over a substrate 20, such as a silicon substrate, an alumina substrate, or other suitable substrates. A seed layer 30 is deposited over the substrate 20. The seed layer 30 comprises a silicide layer 32 or other suitable seed layers. In certain embodiments, the silicide layer 32 comprises NiSi, NiFeSi, NiFeTaSi, NiCuSi, CoSi, CoFeSi, CoFeTaSi, CoCuSi, or combinations thereof. In certain embodiments, the seed layer 30 further comprises a surface control layer 40 between the silicide layer 32 and the BiSbE alloy layer 50. In certain embodiments, the surface control layer 40 comprises NiFe, NiFeTa, NiTa, NiW, NiFeW, NiCu, NiFeCu, CoTa, CoFeTa, NiCoTa, Co, CoM, CoNiM, CoNi, NiSi, CoSi, NiCoSi, Cu, CuAg, CuAgM, CuM, or combinations thereof, in which M is Fe, Cu, Co, Ta, Ag, Ni, Mn, Cr, V, Ti, or Si.

In certain embodiments, an interlayer 70 is deposited over the BiSbE alloy layer 50. The interlayer 70 comprises a silicide layer 72. In certain embodiments, the silicide layer 72 comprises NiSi, FeSi, CoSi, NiCuSi, NiFeTaSi, CoFeSi, CoCuSi, or combinations thereof. In certain embodiments, the interlayer 70 further comprises a surface control layer 71 between the BiSbE alloy layer 50 and the silicide layer 72. The surface control layer 71 comprises Cu, Ni, NiFe, Co, or combinations thereof.

A free perpendicular magnetic anisotropy (PMA) layer 80 is formed over the interlayer 70. For example, the free PMA layer 80 can comprise one or more stacks of a Co/Pt, Co/Pd, Co/Ni, CoFeB, FePt or other PMA inducing layers or combinations thereof. An insulating layer 84, such as a MgO layer, is formed over the free PMA layer 80. A reference PMA layer 88 is formed over the insulating layer 84. The reference PMA layer 88 can comprise one or more stacks of a Co/Pt, Co/Pd, Co/Ni, CoFeB, FePt or other PMA inducing layers or combinations thereof. The reference PMA layer 88 can include one or more synthetic antiferromagnetic (SAF) pinned structures. A cap layer 92 can be formed over the reference PMA layer 88. The cap layer 92 comprises NiFe, SiN, Si, NiFeTa, NiTa, Pt, Co, Cu, Ni, NiCu, CoCu, Ru, Ta, Cr, Au, Rh, CoFe CoFeB, other non-magnetic materials, other magnetic materials, and combinations thereof. The magnetic direction of the reference PMA layer 88 can be set with an anneal of about 270° C. or above for two hours or more. In certain embodiment, the BiSbE alloy layer 50 comprises a metallic dopant element. The metallic dopant element of the BiSbE alloy layer 50 helps to maintain the low interfacial roughness of the BiSbE alloy layer 50 after anneal and helps to the manufacturability, performance, and/or life time of the MRAM device. The BiSbE alloy layer 50 comprises a metallic dopant element has reduced migration of Sb of the BiSbE alloy layer 50 after post annealing in comparison to a BiSb material without dopant elements.

A plurality of the SOT devices 10 can be configured together as part of a memory cell array in which the BiSbE alloy layer 50 is a spin orbit material electrode. A top electrode (not shown) can be disposed over the reference PMA layer 88. Each of the memory cells may be part of a two-terminal device or a three terminal device. The spin orbit material electrode and the top electrode may serve as bit lines, word lines, read word lines, write word lines, and combinations thereof. The memory cell array may be implemented as a cross-point array or other architectures.

Figure 13B:
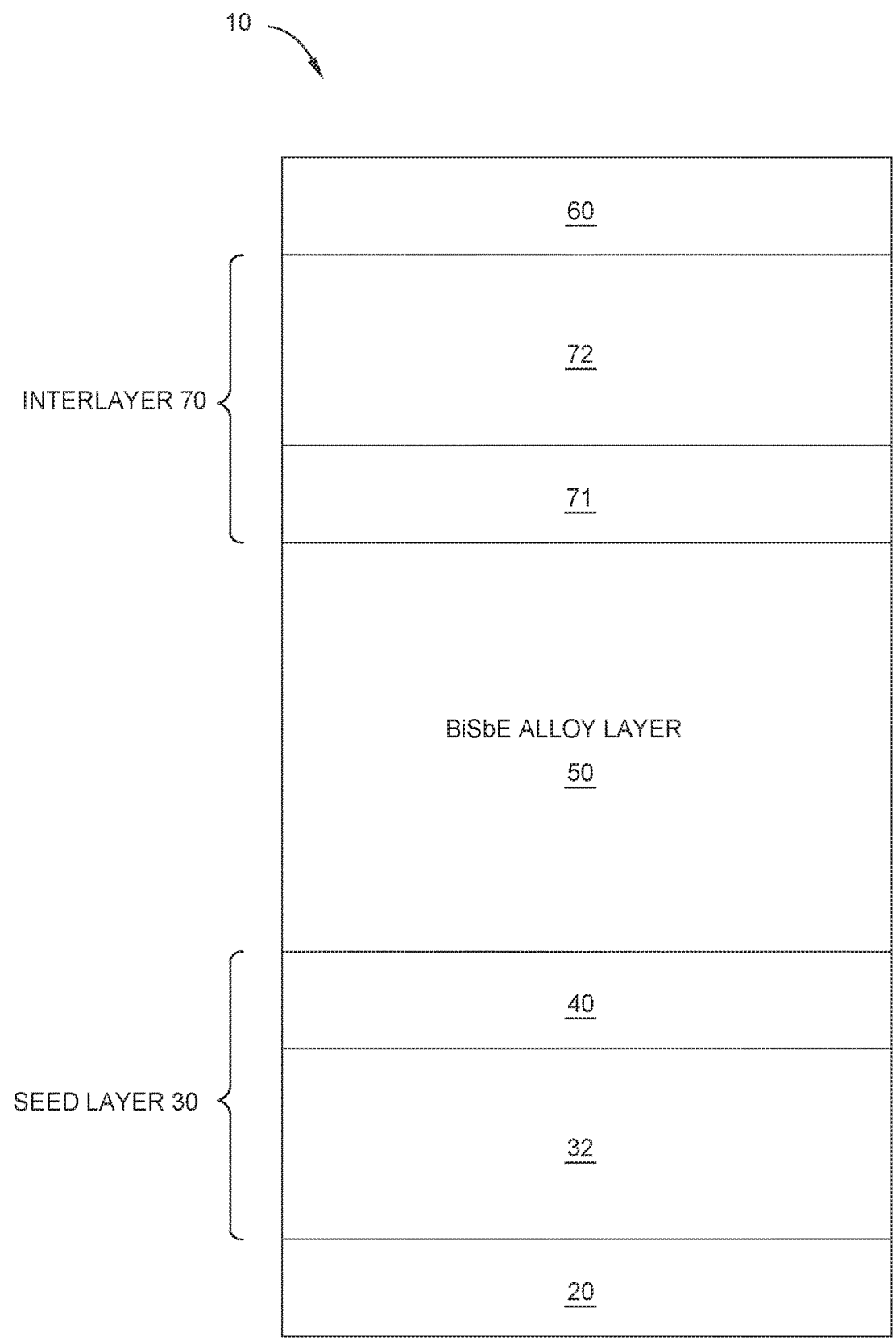
FIG. 13B is a schematic cross-sectional view of certain embodiments of a SOT device having a BiSbE alloy layer with (012) orientation forming a portion or component of a SOT-based energy-assisted magnetic recording (EAMR) write head used in magnetic recording.

FIG. 13B is a schematic cross-sectional view of certain embodiments of a SOT device 10 having a BiSbE alloy layer 50 with (012) orientation forming a portion or component of a SOT-based EAMR write head used in magnetic recording.

The BiSbE alloy layer 50 with (012) orientation is formed over a substrate 20, such as a silicon substrate, an alumina substrate, or other suitable substrates. A seed layer 30 is deposited over the substrate 20. The seed layer 30 comprises a silicide layer 32 or other suitable seed layers. In certain embodiments, the silicide layer 32 comprises NiSi, NiFeSi, NiFeTaSi, NiCuSi, CoSi, CoFeSi, CoFeTaSi, CoCuSi, or combinations thereof. In certain embodiments, the seed layer 30 further comprises a surface control layer 40 between the silicide layer 32 and the BiSbE alloy layer 50. In certain embodiments, the surface control layer 40 comprises NiFe, NiFeTa, NiTa, NiW, NiFeW, NiCu, NiFeCu, CoTa, CoFeTa, NiCoTa, Co, CoM, CoNiM, CoNi, NiSi, CoSi, NiCoSi, Cu, CuAg, CuAgM, CuM, or combinations thereof, in which M is Fe, Cu, Co, Ta, Ag, Ni, Mn, Cr, V, Ti, or Si.

In certain embodiments, an interlayer 70 is deposited over the BiSbE alloy layer 50. The interlayer 70 comprises a silicide layer 72. In certain embodiments, the silicide layer 72 comprises NiSi, FeSi, CoSi, NiCuSi, NiFeTaSi, CoFeSi, CoCuSi, or combinations thereof. In certain embodiments, the interlayer 70 further comprises a surface control layer 71 between the BiSbE alloy layer 50 and the silicide layer 72. The surface control layer 71 comprises Cu, Ni, NiFe, Co, or combinations thereof.

A spin-torque layer (STL) 60 is formed over the interlayer 70. The STL 60 comprises a ferromagnetic material such as one or more layers of CoFe, CoIr, NiFe, and CoFeM wherein M=B, Ta, Re, or Ir. Charge current through a BiSbE alloy layer 50 acting as a spin Hall layer generates a spin current in the BiSbE layer 50. The spin-orbital coupling of the BiSbE alloy layer 50 and a spin torque layer (STL) 60 causes switching or precession of magnetization of the STL 60 by the spin-orbital coupling of the spin current from the BiSbE alloy layer 50. Switching or precession of the magnetization of the STL 60 can generate an assisting DC field to the write field from a main pole of a write head used in magnetic recording. SOT based EAMR elements have multiple times greater power efficiency in comparison to spin-transfer torque (STT) based Microwave-Assisted Magnetic Recording (MAMR) elements. In certain embodiment, the BiSbE alloy layer 50 comprises a metallic dopant element or a non-metallic dopant element. For example, if the SOT-based EAMR write head is not annealed, a BiSbE alloy layer 50 comprising a non-metallic dopant element can be used since degradation of the interfacial roughness due to post annealing is avoided.

A SOT device includes a bismuth antimony dopant element (BiSbE) alloy layer over a substrate. The BiSbE alloy layer is used as a topological insulator, such as for SOT-based MRAM device or for SOT-based EAMR write head. The BiSbE alloy layer includes bismuth, antimony, a dopant element. The dopant element can be a non-metallic dopant element comprising Si, P, Ge, or combinations thereof, a metallic dopant element comprising Ni, Co, Fe, CoFe, NiFe, Cu, Al, Zn, Ag, Ga, In, or combinations thereof, or a combination of a non-metallic dopant element(s) and a metallic dopant element(s). The BiSbE alloy layer can include a plurality of BiSb lamellae layers and one or more dopant element lamellae layers. The BiSbE alloy layer has a (012) orientation. In certain embodiments, the BiSbE alloy layer has a higher annealing temperature, stronger (012) texture, smaller grain size, and/or lower surface roughness in comparison to a BiSb material without dopant elements.

In one embodiment, a SOT device includes a bismuth antimony dopant element (BiSbE) alloy layer over a substrate. The BiSbE alloy layer includes bismuth, antimony, and a dopant element. The dopant element is a non-metallic dopant element, a metallic dopant element, and combinations thereof. Examples of metallic dopant elements include Ni, Co, Fe, CoFe, NiFe, NiCo, NiCu, CoCu, NiAg, CuAg, Cu, Al, Zn, Ag, Ga, In, or combinations thereof. Examples of non-metallic dopant elements include Si, P, Ge, or combinations thereof. The BiSbE alloy layer has a (012) orientation.

In another embodiment, a SOT device includes a bismuth antimony dopant element (BiSbE) alloy layer over a substrate. The BiSbE alloy layer includes a plurality of BiSb lamellae layers and one or more dopant element lamellae layers. Each of the dopant element lamellae layers includes a non-metallic dopant element, a metallic dopant element, and combinations thereof. Examples of metallic dopant elements include Ni, Co, Fe, CoFe, NiFe, NiCo, NiCu, CoCu, NiAg, CuAg, Cu, Al, Zn, Ag, Ga, In, or combinations thereof. Examples of non-metallic dopant elements include Si, P, Ge, or combinations thereof. The BiSbE alloy layer has a (012) orientation.

In still another embodiment, a magnetoresistive random access memory (MRAM) device includes a bismuth antimony dopant element (BiSbE) alloy layer. The BiSbE alloy layer includes bismuth, antimony, and a metallic dopant element. The metallic dopant element is Ni, Co, Fe, CoFe, NiFe, NiCo, NiCu, CoCu, NiAg, CuAg, Cu, Al, Zn, Ag, Ga, In, or combinations thereof. The BiSbE alloy layer having a (012) orientation. The MRAM device further includes a perpendicular magnetic anisotropy (PMA) ferromagnetic layer.

EXAMPLES

The following are examples to illustrate various embodiments of a BiSbE alloy layer 50, 100, 200 of FIG. 1, 2A-2H, or 13A-13B, other SOT devices, and variations thereof. These examples are not meant to limit the scope of the claims unless specifically recited in the claims.

Example 1

Figure 3:
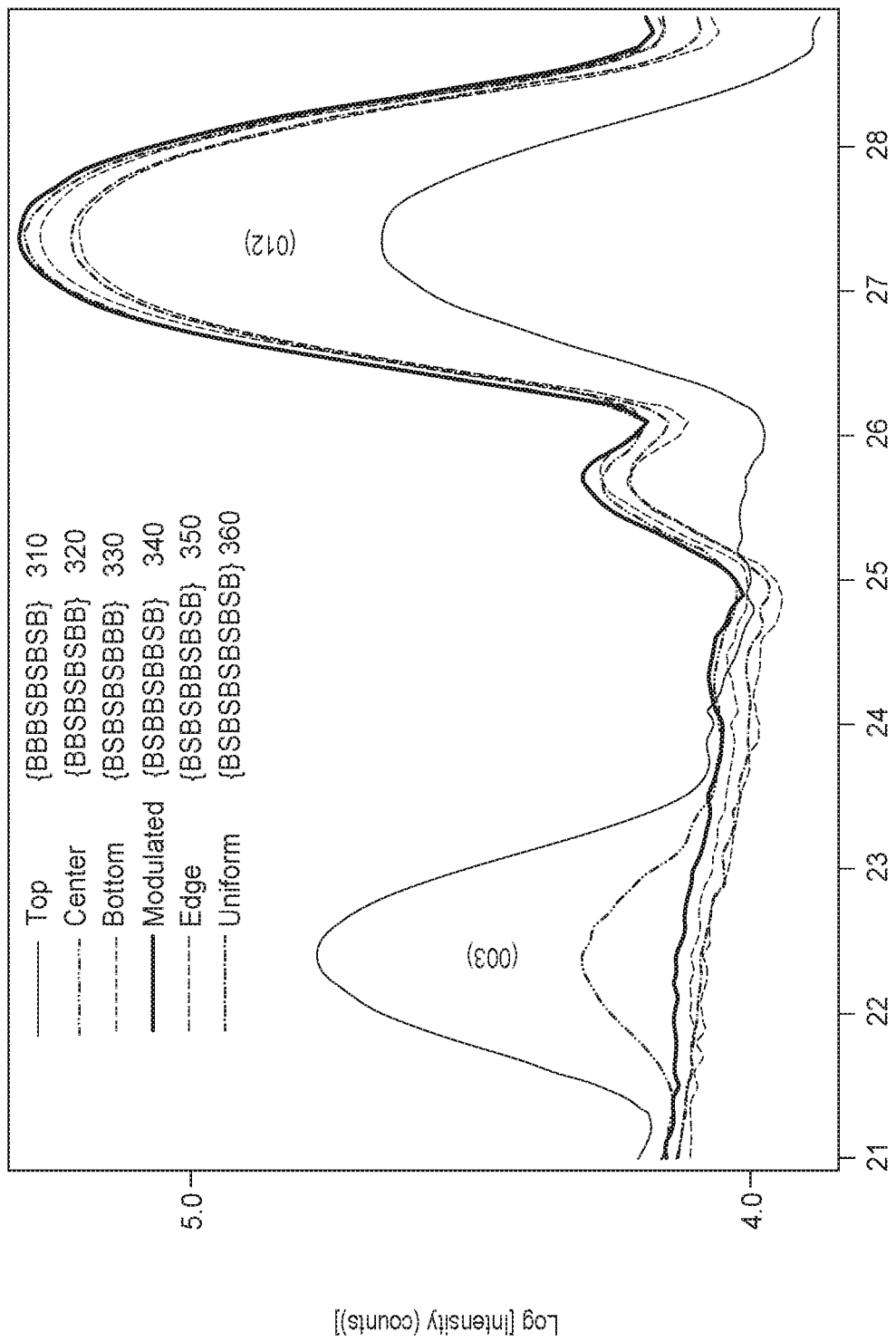
FIG. 3 shows 2-theta XRD scans vs. logarithm of the intensity of the BiSb orientation of various stacks of BiSbE alloy layers comprising a non-metallic dopant element of Si.

FIG. 3 shows 2-theta XRD scans vs. logarithm of the intensity of the BiSb orientation of various stacks 310-360 of BiSbE alloy layers comprising a non-metallic dopant element of Si. Each of the stacks 310-360 comprised a seed layer of a NiFeCu-silicide layer formed to a thickness of about 18 Å and a copper alloy (CuAgNi) layer formed to a thickness of about 1 Å, a BiSbE alloy layer formed to a thickness of about 100 Å, an interlayer of a NiFe-silicide layer formed to a thickness of about 14 Å, and a cap layer of SiN formed to a thickness of 60 Å. The BiSbSi alloy layers comprised a plurality of BiSb lamellae layers and a plurality of Si lamellae layers in which the dopant element comprised Si. Each of the BiSb lamellae layers comprised about 90 atomic % of Bi and about 10 atomic % of Sb.

The BiSbE alloy layer of stack 310 was formed by depositing six BiSb lamellae layers with each BiSb lamella layer deposited to a thickness of about 15 Å and by depositing three Si lamellae layers with each Si lamella layer deposited to a thickness of about 0.5 Å. The Si lamellae layers were deposited at the top edge of the BiSbE alloy layer in the order of BiSb-BiSb-BiSb-Si-BiSb-Si-BiSb-Si-BiSb (BBBSBSBSB).

The BiSbE alloy layer of stack 320 was formed by depositing six BiSb lamellae layers with each BiSb lamella layer deposited to a thickness of about 15 Å and by depositing three Si lamellae layers with each Si lamella layer deposited to a thickness of about 0.5 Å. The Si lamellae layers were deposited at the center of the BiSbE alloy layer in the order of BiSb-BiSb-Si-BiSb-Si-BiSb-Si-BiSb-BiSb (BBSBSBSBB).

The BiSbE alloy layer of stack 330 was formed by depositing six BiSb lamellae layers with each BiSb lamella layer deposited to a thickness of about 15 Å and by depositing three Si lamellae layers with each Si lamella layer deposited to a thickness of about 0.5 Å. The Si lamellae layers were deposited at the bottom edge of the BiSbE alloy layer in the order of BiSb-Si-BiSb-Si-BiSb-Si-BiSb-BiSb-BiSb (BSBSBSBBB).

The BiSbE alloy layer of stack 340 was formed by depositing six BiSb lamellae layers with each BiSb lamella layer deposited to a thickness of about 15 Å and by depositing three Si lamellae layers with each Si lamella layer deposited to a thickness of about 0.5 Å. The Si lamellae layers were modulated within the BiSbE alloy layer in the order of BiSb-Si-BiSb-BiSb-Si-BiSb-BiSb-Si-BiSb (BSBBSBBSB).

The BiSbE alloy layer of stack 350 was formed by depositing six BiSb lamellae layers with each BiSb lamella layer deposited to a thickness of about 15 Å and by depositing four Si lamellae layers with each Si lamella layer deposited to a thickness of about 0.5 Å. The Si lamellae layers were deposited at the bottom edge and the top edge of the BiSbE alloy layer in the order of BiSb-Si-BiSb-Si-BiSb-BiSb-Si-BiSb-Si-BiSb (BSBSBBBSBSB).

The BiSbE alloy layer of stack 360 was formed by depositing six BiSb lamellae layers with each BiSb lamella layer deposited to a thickness of about 15 Å and by depositing five Si lamellae layers with each Si lamella layer deposited to a thickness of about 0.5 Å. The Si lamellae layers were deposited throughout the BiSbE alloy layer in the order of BiSb-Si-BiSb-Si-BiSb-Si-BiSb-Si-BiSb-Si-BiSb (BSBSBSBSBSB).

Stack 310 with a top edge distribution of the dopant element Si and stack 320 with a center distribution of dopant element Si do not promote strong BiSbSi (012) orientation. Stack 330 with a bottom edge distribution of dopant element Si, stack 340 with a modulated distribution of dopant element Si, stack 350 with a bottom edge and top edge distribution of dopant element Si, and stack 360 with a dopant element Si distribution the throughout the BiSbE alloy layer promoted strong BiSbSi(012) orientation.

Example 2

Figure 4:
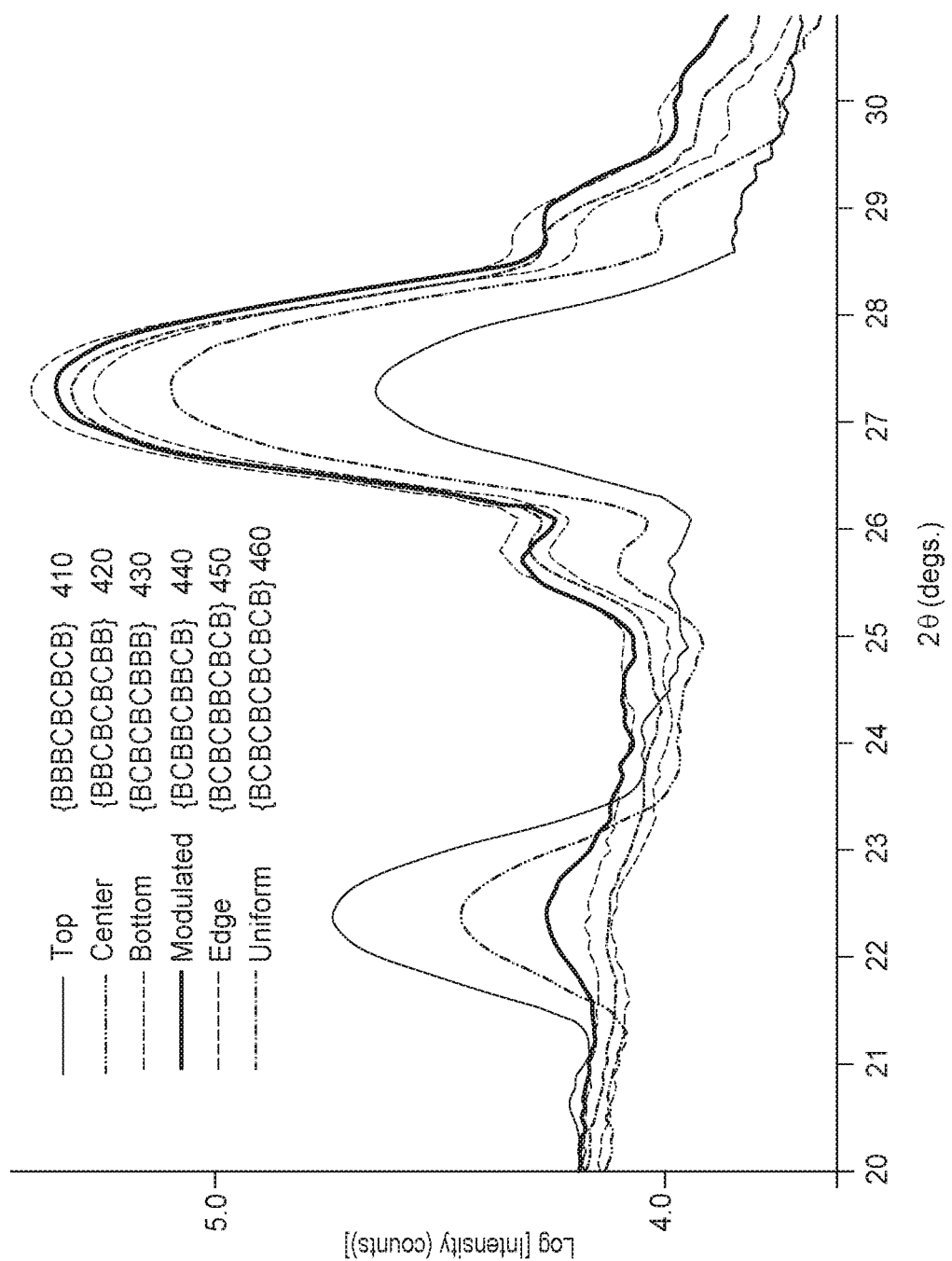
FIG. 4 shows 2-theta XRD scans vs. logarithm of the intensity of the BiSb orientation of various stacks of BiSbE alloy layers comprising a metallic dopant element of CuAgNi.

FIG. 4 shows 2-theta XRD scans vs. logarithm of the intensity of the BiSb orientation of various stacks 410-460 of BiSbE alloy layers comprising a metallic dopant element of CuAgNi. The BiSbE alloy layers comprised a plurality of BiSb lamellae layers and a plurality of lamellae layers of metallic dopant element of CuAgNi. Each of the BiSb lamellae layers comprised about 90 atomic % of Bi and about 10 atomic % of Sb. Each of the stacks 410-460 comprised a seed layer of a NiFeCu-silicide layer formed to a thickness of about 18 Å, a BiSbE alloy layer formed to a thickness of about 100 Å, an interlayer of a NiFe-silicide layer formed to a thickness of about 14 Å, and a cap layer of SiN formed to a thickness of 60 Å.

The BiSbE alloy layer of stack 410 was formed by depositing six BiSb lamellae layers with each BiSb lamella layer deposited to a thickness of about 15 Å and by depositing three CuAgNi lamellae layers with each CuAgNi lamella layer deposited to a thickness of about 0.5 Å. The CuAgNi lamellae layers were deposited at the top edge of the BiSbE alloy layer in the order of BiSb-BiSb-BiSb-CuAgNi-BiSb-CuAgNi-BiSb-CuAgNi-BiSb (BBBCBCBB).

The BiSbE alloy layer of stack 420 was formed by depositing six BiSb lamellae layers with each BiSb lamella layer deposited to a thickness of about 15 Å and by depositing three CuAgNi lamellae layers with each CuAgNi lamella layer deposited to a thickness of about 0.5 Å. The CuAgNi lamellae layers were deposited at the center of the BiSbE alloy layer in the order of BiSb-BiSb-CuAgNi-BiSb-CuAgNi-BiSb-CuAgNi-BiSb-BiSb (BBCBCBCBB).

The BiSbE alloy layer of stack 430 was formed by depositing six BiSb lamellae layers with each BiSb lamella layer deposited to a thickness of about 15 Å and by depositing three CuAgNi lamellae layers with each CuAgNi lamella layer deposited to a thickness of about 0.5 Å. The CuAgNi lamellae layers were deposited at the bottom edge of the BiSbE alloy layer in the order of BiSb-CuAgNi-BiSb-CuAgNi-BiSb-CuAgNi-BiSb-BiSb-BiSb (BCBCBCBBB).

The BiSbE alloy layer of stack 440 was formed by depositing six BiSb lamellae layers with each BiSb lamella layer deposited to a thickness of about 15 Å and by depositing three CuAgNi lamellae layers with each CuAgNi lamella layer deposited to a thickness of about 0.5 Å. The CuAgNi lamellae layers were modulated within the BiSbE alloy layer in the order of BiSb-CuAgNi-BiSb-BiSb-CuAgNi-BiSb-BiSb-CuAgNi-BiSb (BCBBCBBCB).

The BiSbE alloy layer of stack 450 was formed by depositing six BiSb lamellae layers with each BiSb lamella layer deposited to a thickness of about 15 Å and by depositing four CuAgNi lamellae layers with each CuAgNi lamella layer deposited to a thickness of about 0.5 Å. The CuAgNi lamellae layers were deposited at the bottom edge and the top edge of the BiSbE alloy layer in the order of BiSb-CuAgNi-BiSb-CuAgNi-BiSb-BiSb-CuAgNi-BiSb-CuAgNi-BiSb (BCBCBB-CBCB).

The BiSbE alloy layer of stack 460 was formed by depositing six BiSb lamellae layers with each BiSb lamella layer deposited to a thickness of about 15 Å and by depositing five CuAgNi lamellae layers with each CuAgNi lamella layer deposited to a thickness of about 0.5 Å. The CuAgNi lamellae layers were deposited throughout the BiSbE alloy layer in the order of BiSb-CuAgNi-BiSb-CuAgNi-BiSb-CuAgNi-BiSb-CuAgNi-BiSb-CuAgNi-BiSb (BCBCBCBCBCB).

Stack 410 with a top edge distribution of the CuAgNi, stack 420 with a center distribution of CuAgNi, and stack 440 with a modulated distribution of CuAgNi do not promote strong BiSbE (012) orientation. Stack 430 with a bottom edge distribution of CuAgNi, stack 450 with a bottom edge and top edge distribution of CuAgNi, and stack 460 with a CuAgNi distribution throughout the BiSbE alloy layer promoted strong BiSbE(012) orientation.

Example 3

Figure 5:
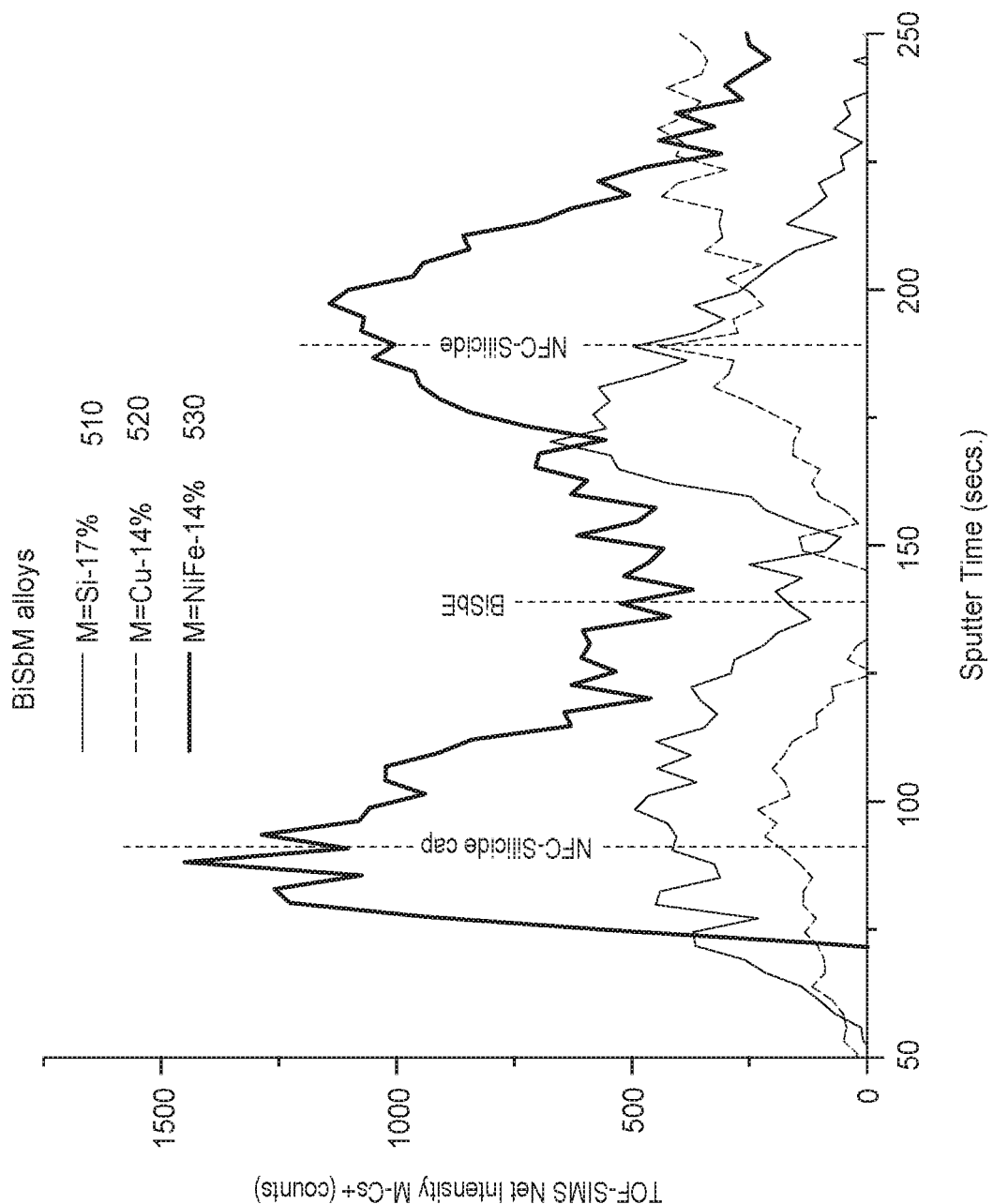
FIG. 5 shows TOF-SIMS net intensity for dopant E-Cs+ clusters across the BiSbE alloy layer for dopant elements of NiFe, Si, and CuAgNi.

FIG. 5 shows a plot of the TOF-SIMS net Intensity for dopant E-Cs+ clusters across the BiSbE alloy layer for dopant elements of NiFe, Si, and CuAgNi as a function of sputter time in seconds. BiSbE sample 510 with atomic percent content of a dopant element of silicon of about 17%, a BiSbE sample 520 with atomic percent content of a dopant element of CuAgNi of about 14%, a BiSbE sample 530 with atomic percent content of a dopant element of NiFe of about 14%. BiSbE sample 510 was formed with a modulated distribution of Si dopant element. BiSbE sample 520 was formed with an edge distribution of CuAgNi dopant element. BiSbE sample 530 was formed with an edge distribution of NiFe dopant element. The net intensity is the absolute intensity of the E-Cs+ cluster of BiSbE minus the intensity of E-Cs+ cluster of a BiSbE which contains no dopant element. Each of the samples 510-530 included a NiFeCu silicide seed layer of about 16 Å, about 1 Å of Cu, about 7 Å of NiFe, about 1 Å of Cu, and a NiFeCu silicide cap layer of about 2 Å of Cu, 16 Å of Si, and 8 Å of NiFe. The locations of the centers of the NiFeCu silicide seed layer, the NiFeCu silicide cap layer, and the BiSbE alloy layer are indicated with vertical black dashed lines.

FIG. 5 shows a portion of the dopant elements are pushed out of the BiSbE alloy layer. FIG. 5 shows a non-zero net TOF-SIMS intensity inside the BiSbE alloy layer indicating a portion of the dopant elements remain in the BiSbE lattice after deposition.

Example 4

Figure 6:
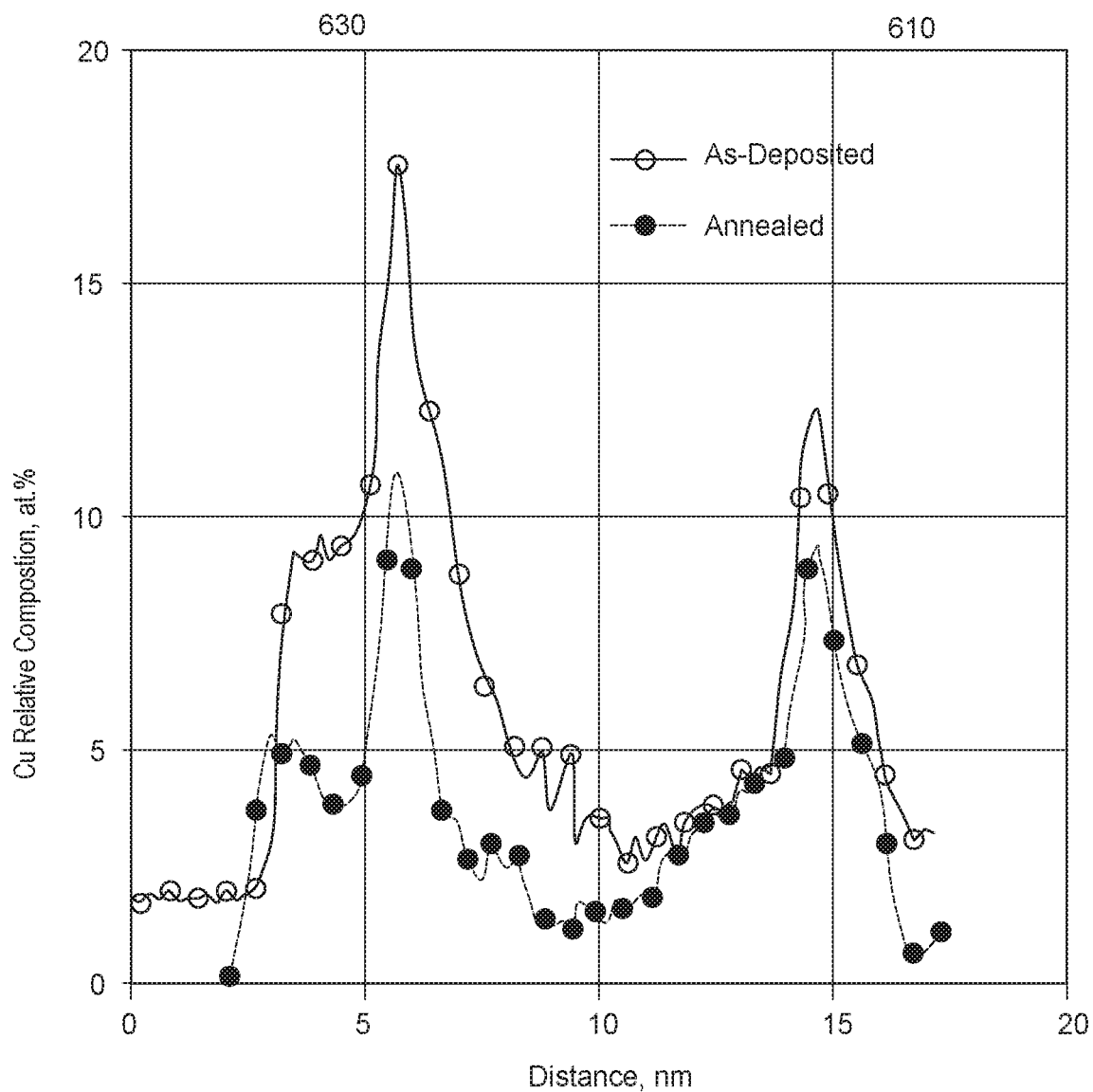
FIG. 6 shows TEM Cu EELS scans across a BiSbE stack comprising a silicide cap layer, a BiSbE alloy layer comprising a metallic dopant of CuAgNi, and a silicide seed layer.

FIG. 6 shows TEM Cu EELS scans across a BiSbE stack comprising a silicide cap layer, a BiSbE alloy layer comprising a metallic dopant of CuAgNi, and a silicide seed layer. The BiSbE alloy layer comprised a metallic dopant of CuAgNi in an atomic percent content of about 6%. The metallic dopant of CuAgNi comprised Ag in an atomic percent content of about 5% and with Ni in an atomic percent content of about 10%. The BiSbE stack included a NiFeCu silicide seed layer of about 20 Å, about 1 Å of Cu, a BiSbE alloy layer of about 100 Å, a NiFeCu silicide cap layer of about 30 Å, and a SiN layer of about 60 Å.

The BiSbE alloy layer comprised the metallic dopant element in the center of the BiSbE alloy layer going higher towards the interfaces for both room temperature and after post annealing at about 280° C. for 3 hours. A portion of the CuAgNi dopant element is leaving BiSb lattice and a portion of the CuAgNi dopant element is retained in the BiSb lattice even after the post annealing near the melting point of the BiSbE alloy layer.

A portion of the dopant element has been retained in the lattice after near melting. It is believed that on anneal the BiSbE lattice relaxed the lattice parameters with a portion of the dopant elements residing within the BiSbE lattice forming the alloy and with a portion diffusing to the interlayer interfaces or to the grain boundaries.

Example 5

Figure 7:
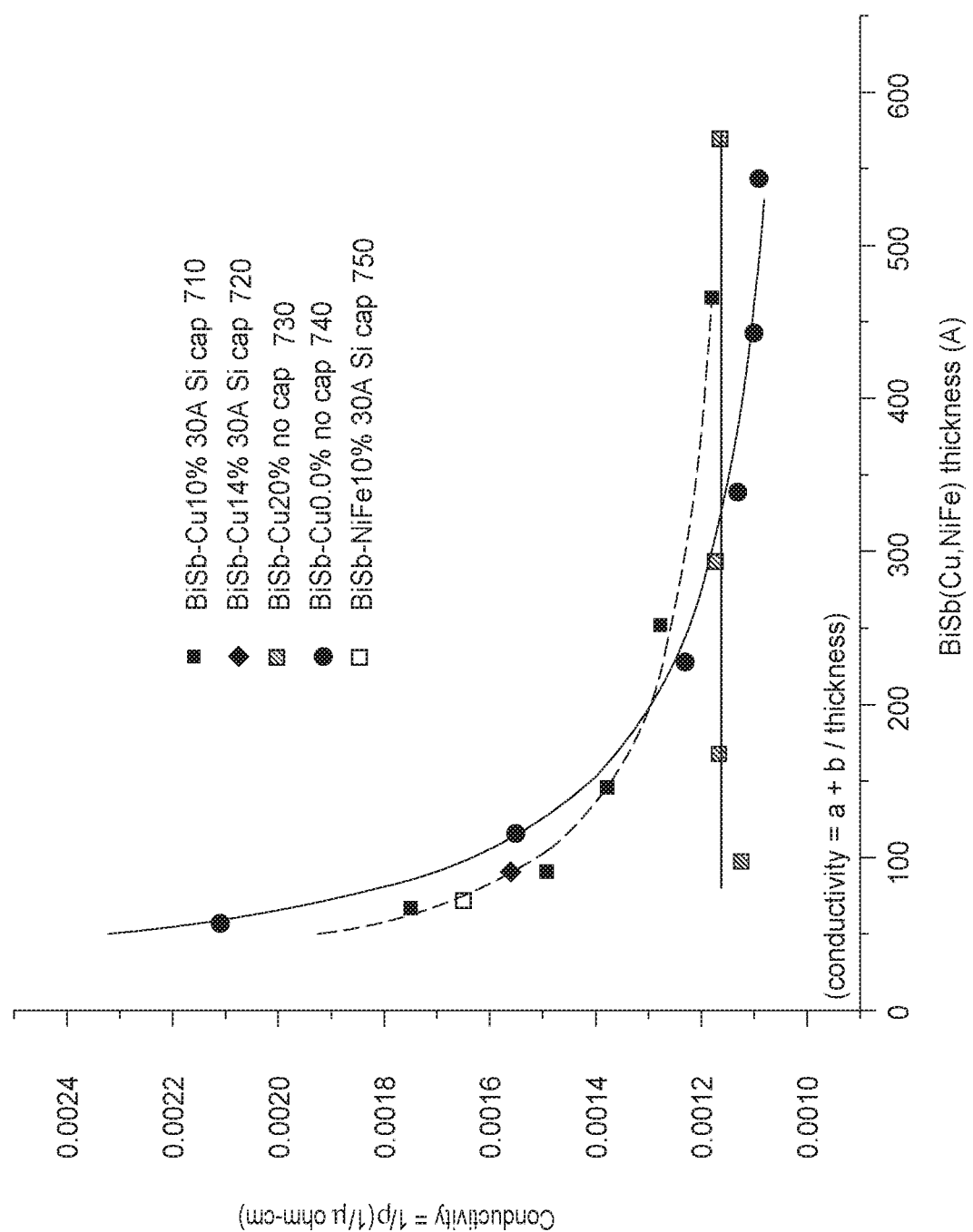
FIG. 7 shows the conductivity versus thickness of various BiSbE alloy layers comprising a metallic dopant.

FIG. 7 shows the as deposited conductivity versus thickness of BiSbE alloy layers 710-750 comprising a metallic dopant as measured by XRR/XRF. Each of the BiSbE alloy layers 710-750 were formed over a Si seed layer having a thickness of about 30 Å. Conductivity (1/Resistance) was measured using a four-point probe. The fitted curves assume a 2-resistor model of a surface conductive layer and a bulk conductive layer and fit an 'A+B/thickness' model.

BiSb layer 710 is a layer of pure BiSb without dopant elements, BiSbE alloy layer 720 comprised BiSbCu with an atomic percent content of Cu of about 10%. BiSbE alloy layer 730 comprised BiSbCu with an atomic percent content of Cu of about 14%. BiSbE alloy layer 740 comprised BiSbCu with an atomic percent content of Cu of about 20%. BiSbE alloy layer 750 comprised BiSb-NiFe with an atomic percent content of NiFe of about 10%.

BiSbE alloy layers 720, 730, 750 showed good topological insulator properties similar to reference BiSb layer 710. BiSbE alloy layer 740 showed bulk conduction rather than topological insulator properties.

Example 6

Figure 8:
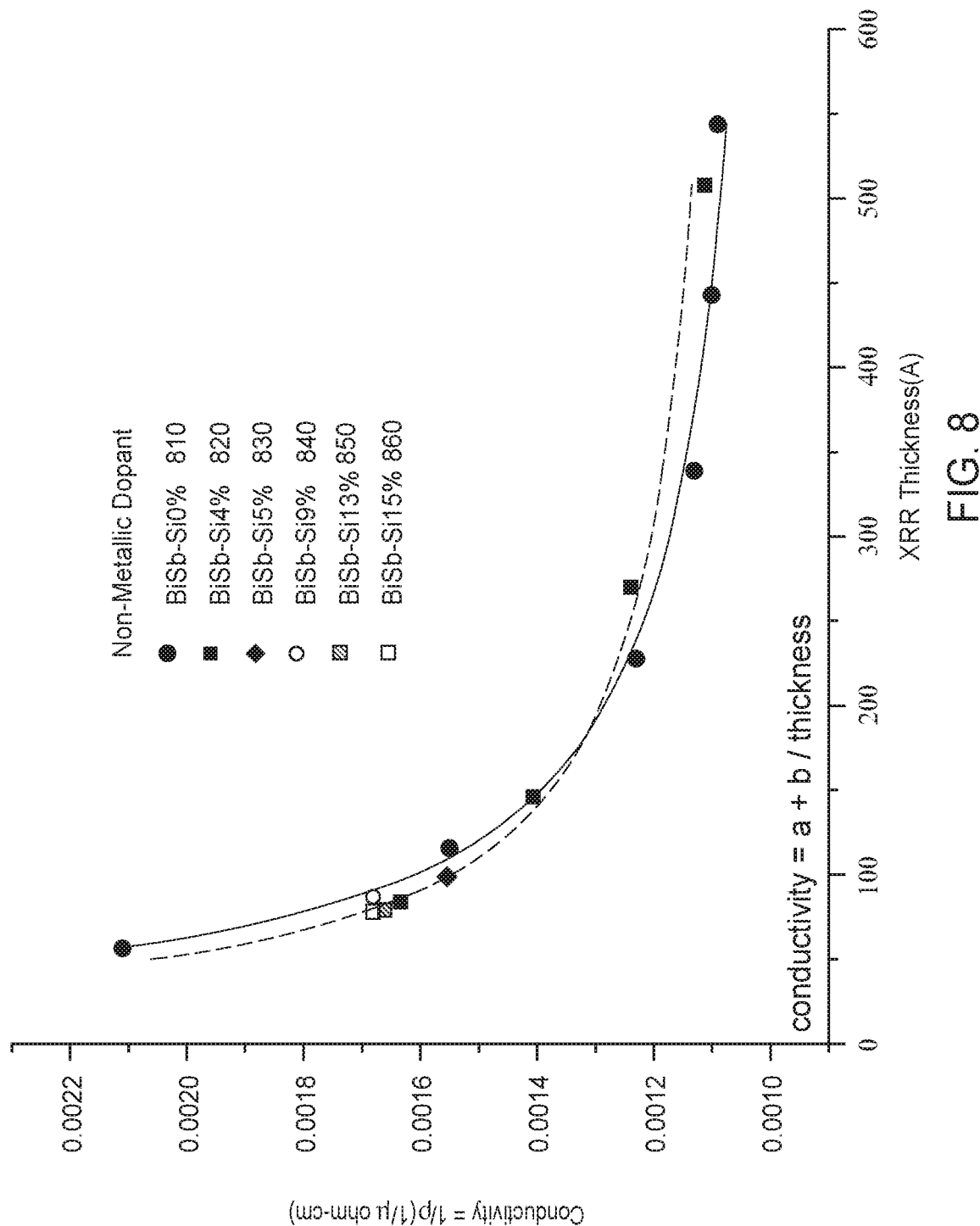
FIG. 8 shows the conductivity versus thickness of various BiSbE alloy layers comprising a non-metallic dopant element.

FIG. 8 shows the as deposited conductivity versus thickness of various BiSbE alloy layers 820-860 comprising a non-metallic dopant elements of Si as measured by XRR/XRF. Each of the BiSbE alloy layers 820-860 were measured for thickness by XRR and were formed over a Si seed layer having a thickness of about 30 Å. Conductivity (1/Resistance) was measured using a four-point probe. The fitted curves assume a 2-resistor model of a surface conductive layer and a bulk conductive layer and fit an 'A+B/thickness' model.

BiSb alloy layer 810 comprised BiSb as a reference layer. BiSbE alloy layer 820 comprised BiSbSi with an atomic percent content of Si of about 4%. BiSbE alloy layer 830 comprised BiSbSi with an atomic percent content of Si of about 5%. BiSbE alloy layer 840 comprised BiSbSi with an atomic percent content of Si of about 9%. BiSbE alloy layer 850 comprised BiSbSi with an atomic percent content of Si of about 13%. BiSbE alloy layer 860 comprised BiSbSi with an atomic percent content of Si of about 15%.

BiSbE alloy layers 820-860 showed good topological insulator properties similar to BiSb reference layer 810 after deposition. BiSbE alloys layers comprising BiSbSi having an atomic percent content of Si from 0% to about 15% showed good topological insulator properties.

Example 7

Figure 9:
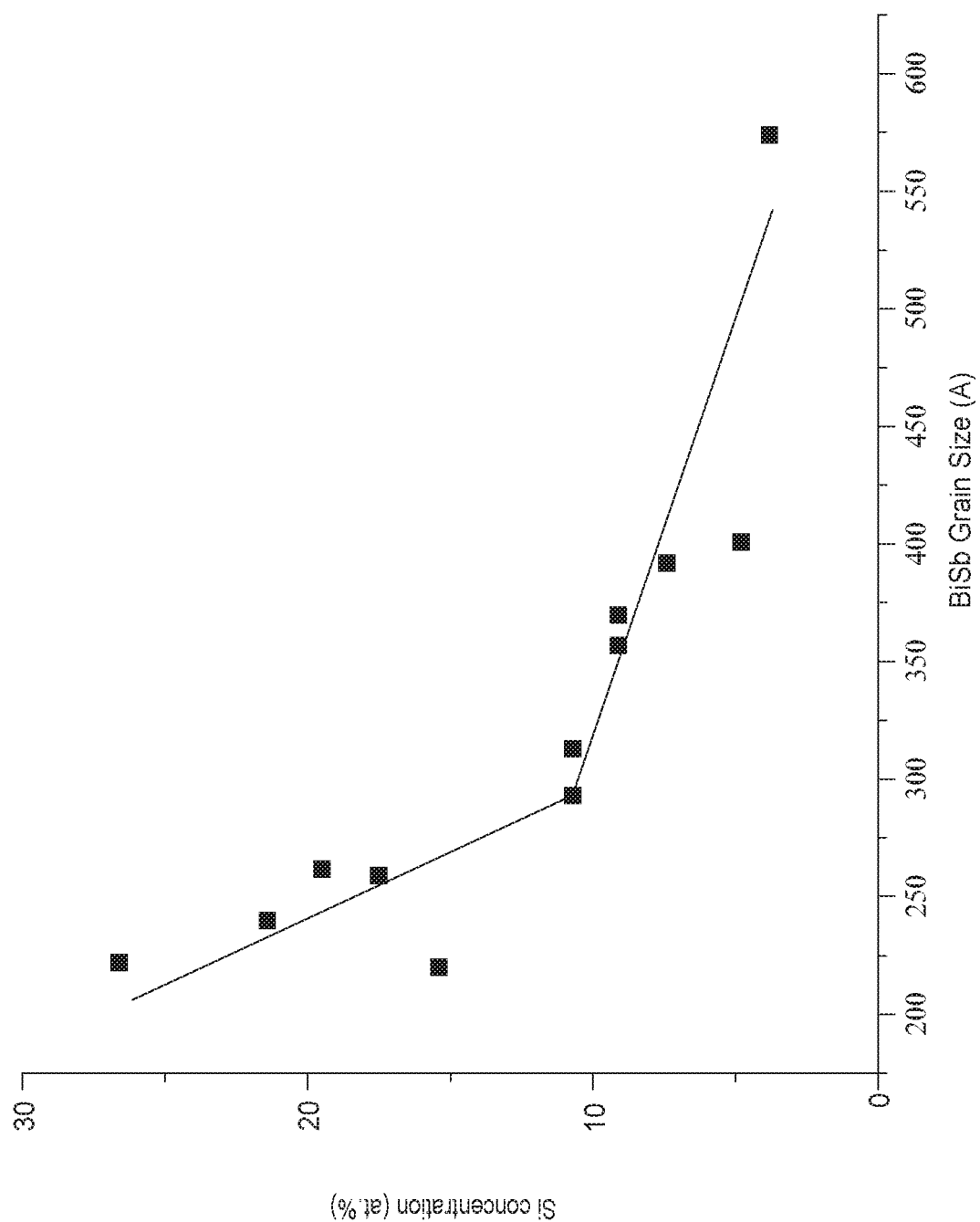
FIG. 9 shows non-metallic dopant element of Si concentration for as-deposited room temperature BiSbSi alloys vs. BiSbSi grain size as measured by inplane XRD patterns taken at 1 deg incident angle of various Si dopant element concentrations.

FIG. 9 shows Si dopant element concentration for BiSbSi alloys vs. BiSbSi grain sizes as measured by inplane XRD patterns taken at 1 deg incident angle of various BiSbSi alloy layers. Each of the BiSbSi alloy layers were formed over a-Si seed layer having a thickness of about 30 Å and with a Si cap layer formed over the BiSbSi alloy layer having a thickness of about 30 Å. The BiSbSi alloy layers showed a large reduction trend in grain size as the atomic percent of Si is increased from 0% to about 10%. The BiSbSi alloy layers showed a small reduction trend in grain size as the atomic percent of Si is increased from more than about 10%. Although the grain size of a BiSbSi alloy with an about 10 atomic % content of Si is much reduced in comparison to a BiSb material without dopant elements, further increasing the atomic percent content of Si above 10% produces only a small additional reduction in the grain size.

Example 8

Figure 10:
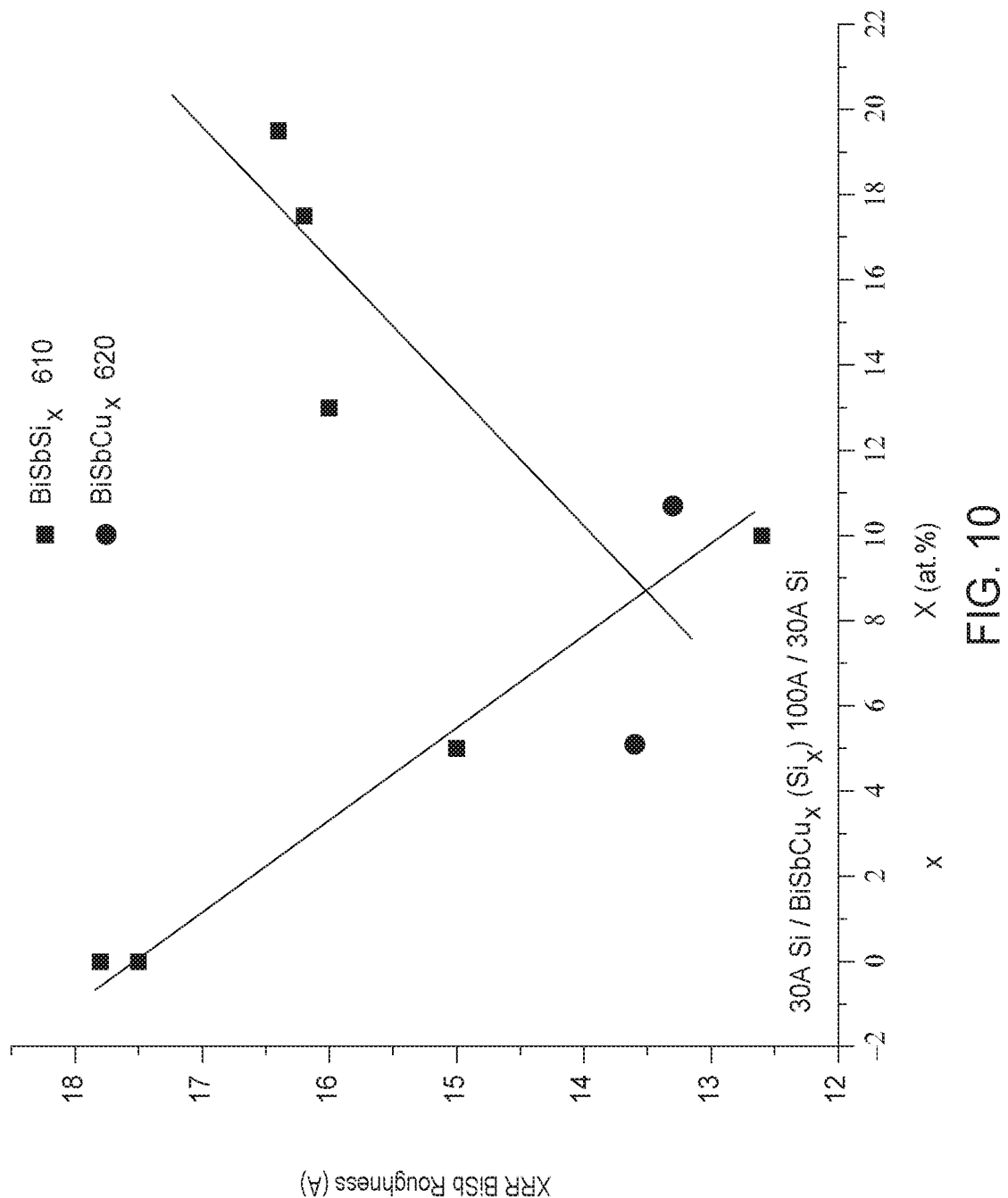
FIG. 10 shows the surface roughness of BiSbE alloy layers as determined by XRR as a function of atomic percent content of non-metallic dopant element of Si.

FIG. 10 shows the surface roughness of BiSbE alloy layers 610, 620 as determined by XRR as a function of atomic percent content of non-metallic dopant element of Si. Each of the BiSbE alloy layers were formed over a Si seed layer having a thickness of about 30 Å and a Si capping layer formed thereover having a thickness of about 30 Å. Each of the BiSbE alloy layers were deposited to a thickness of about 100 Å. BiSbE alloy layer 610 comprised BiSbSi with varying atomic percent content of silicon. BiSbE alloy layer 620 comprised BiSbCu with varying atomic percent content of copper.

FIG. 10 shows that the dopant elements reduced interface roughness in comparison to a BiSb layer without dopant elements. The BiSbE alloy layer with an atomic percent content of the dopant element from about 3% to about 12% produced a large reduction in surface roughness in comparison to a BiSb material without dopant elements. The BiSbE alloy layer with an atomic percent content of the dopant element greater than 12% were comparable to a BiSb material without dopant elements with larger interfacial roughness.

Example 9

Figure 11:
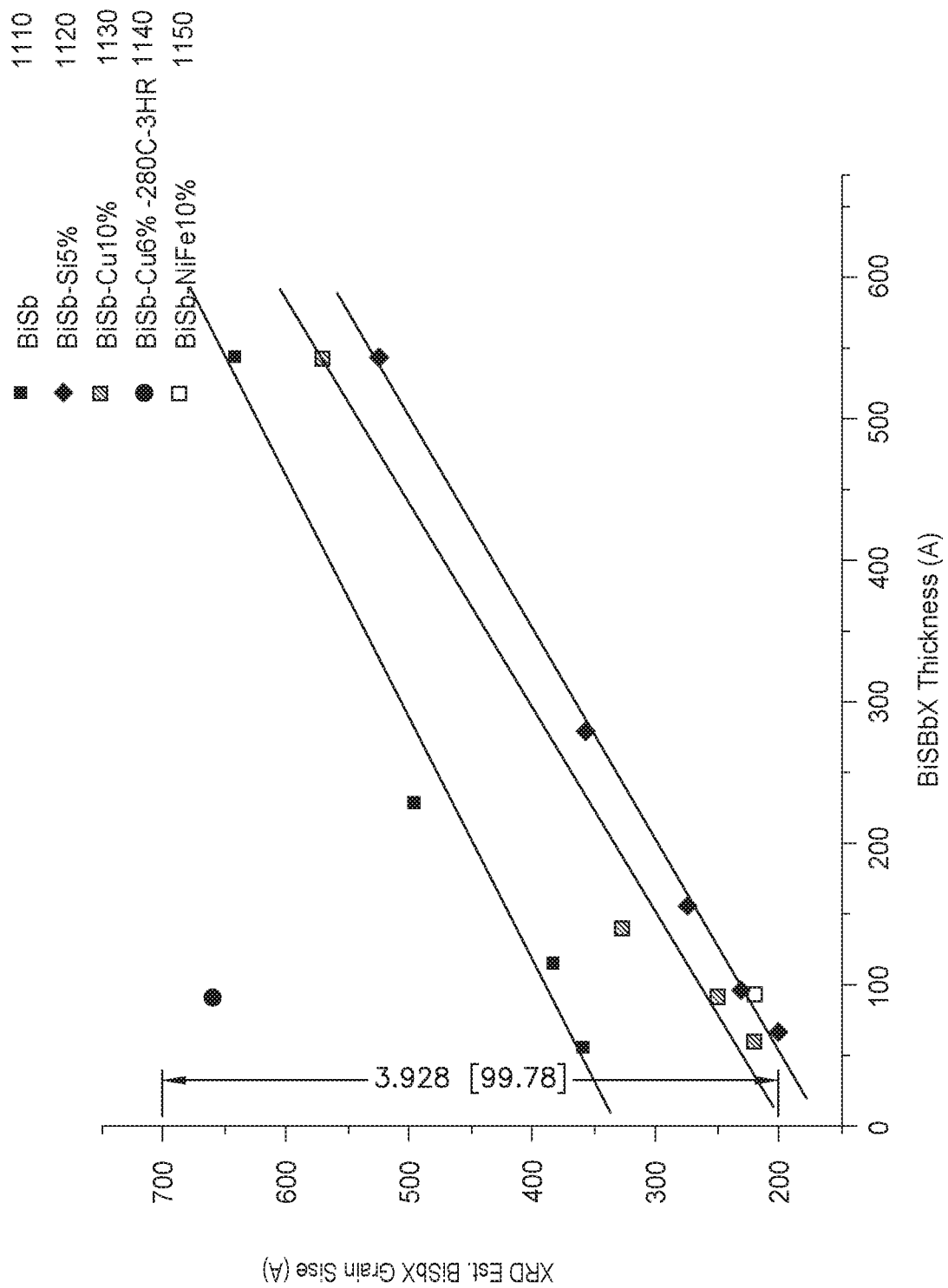
FIG. 11 shows the BiSbE alloy estimated grain size vs. estimated thickness for BiSbE for a non-metallic dopant element and for metallic dopant elements.

FIG. 11 shows the BiSbE alloy estimated grain size from in plane XRD patterns taken at approximately 1 deg. incident angle vs. estimated thickness for BiSbE by XRR for a non-metallic dopant element of Si, a metallic dopant element of Cu, a metallic dopant element of NiFe compared to BiSb without dopant elements. Estimated dopant element concentrations deposited into the film are given in the plot. BiSb layer 1110 comprised BiSb without dopant elements. BiSbE alloy layer 1120 comprised a dopant element Si in an atomic percent content of about 5%. BiSbE alloy layer 1130 comprised dopant element Cu in an atomic percent content of about 10%. BiSbE alloy layer 1140 comprised dopant element Cu in an atomic percent content of about Cu6% which was annealed at about 280° C. for 3 hours. BiSbE alloy layer 1150 comprised dopant element NiFe in an atomic percent content of about 10%. Dopant elements reduce the grain size for all BiSbE alloy thicknesses.

Example 10

Figure 12:
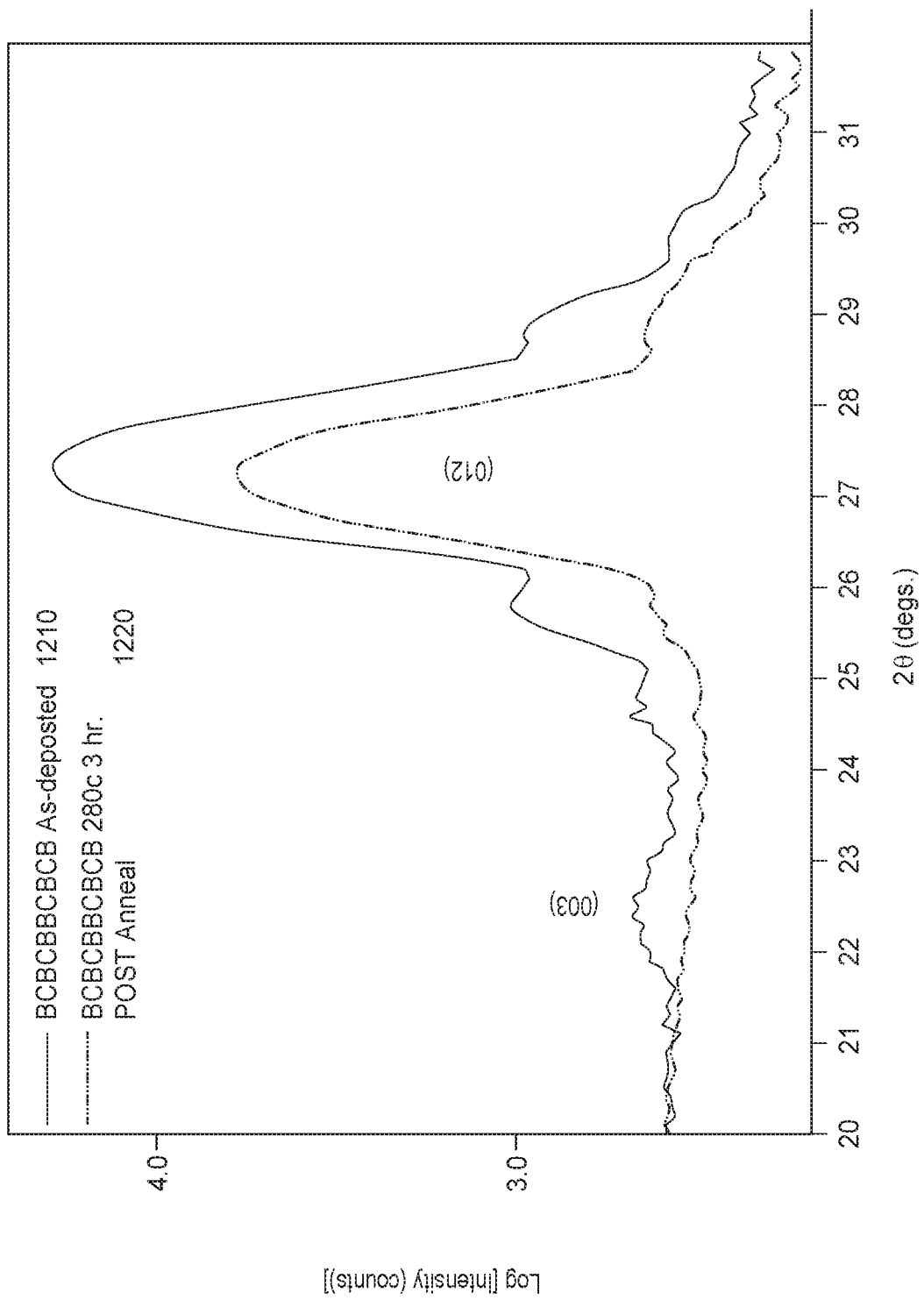
FIG. 12 is a plot of the logarithm of the intensity versus 2-theta XRD out-of-the plane or coupled scans of BiSbE stacks.

FIG. 12 is a plot of the logarithm of the intensity versus 2-theta XRD out-of-the plane or coupled scans of BiSbE stacks 1210, 1220. The BiSbE alloy layer comprised a metallic dopant of CuAgNi in an atomic percent content of about 6%. The metallic dopant of CuAgNi comprised Ag in an atomic percent content of about 5% and with Ni in an atomic percent content of about 10%. The BiSbE alloy layer was formed by depositing six BiSb lamellae layers and by depositing four CuAgNi lamellae layers. The CuAgNi lamellae layers were deposited at the bottom edge and the top edge of the BiSbE alloy layer in the order of BiSb-CuAgNi-BiSb-CuAgNi-BiSb-BiSb-CuAgNi-BiSb-CuAgNi-BiSb (BCBCBBCBCB).

Each of the stacks 1210, 1220 comprised a NiFeCu-silicide layer formed to a thickness of about 20 Å, a copper layer formed to a thickness of about 1 Å, a BiSbE alloy layer formed to a thickness of about 100 Å, an NiFeCu-silicide layer formed to a thickness of about 14 Å, and a capping layer of SiN formed to a thickness of about 60 Å. BiSbE stack 1210 was before annealing. BiSbE stack 1220 is after annealing at about 280° C. for about 3 hours near the melting point of BiSb. BiSbE stacks 1210, 1220 showed strong (012) texture before and after annealing. The BiSbE stack 1220 showed strong (012) texture even after annealing near the melting point of BiSb with a rocking curve of about 11 degrees or less, such as from 7 degrees to 11 degrees. An XRR measurement of the BiSbE stack 1220 after anneal showed a low surface roughness of about 14 Å or less.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
   a substrate; and
   a bismuth antimony dopant element (BiSbE) alloy layer over the substrate, the BiSbE alloy layer having a (012) orientation, the BiSbE alloy layer comprising,
   bismuth;
   antimony; and
   one or more dopant element lamellae layers at least at a top edge of the BiSbE alloy layer, each of the one or more dopant element lamellae layers comprising a dopant element comprising a material selected from a group consisting of a non-metallic dopant element, a metallic dopant element, and combinations thereof.

2. The SOT device of claim 1, wherein the dopant element is the metallic dopant element selected from a group consisting Ni, Co, Fe, CoFe, NiFe, NiCo, NiCu, CoCu, NiAg, CuAg, Cu, Al, Zn, Ag, Ga, In, and combinations thereof.

3. The SOT device of claim 1, wherein the dopant element is the non-metallic dopant element is selected from a group consisting Si, P, Ge, and combinations thereof.

4. The SOT device of claim 1, wherein the BiSbE alloy layer comprises the dopant element from 0.5 atomic % to 15 atomic %.

5. The SOT device of claim 1, wherein the BiSbE alloy layer comprises $Bi_{1-x}Sb_xE$ wherein x is 0.05<x<0.22.

6. The SOT device of claim 1, wherein the BiSbE alloy layer is formed to a thickness from 20 Å to 200 Å.

7. A SOT MRAM device, comprising the SOT device of claim 1, wherein the BiSbE alloy layer is a spin orbit material electrode proximate to a free perpendicular magnetic anisotropy ferromagnetic layer.

8. A SOT-based energy-assisted magnetic recording (EAMR) write heads, comprising the SOT device of claim 1, wherein the BiSbE alloy layer is proximate to a spin-torque layer.

9. The SOT device of claim 1, wherein the BiSbE alloy layer further comprises the one or more dopant element lamellae layers throughout the BiSbE alloy layer.

10. A spin-orbit torque (SOT) device, comprising:
    a substrate; and
    a bismuth antimony dopant element (BiSbE) alloy layer over the substrate, the BiSbE alloy layer having a (012) orientation, the BiSbE alloy layer comprising,
    a plurality of BiSb lamellae layers; and
    one or more dopant element lamellae layers, each of the dopant element lamellae layers comprising a material selected from a group a non-metallic dopant element, a metallic dopant element, and combinations thereof, wherein the one or more dopant element lamellae layers are at a bottom edge of the BiSbE alloy layer and throughout the BiSbE alloy layer.

11. The SOT device of claim 10, wherein each of the dopant element lamellae layers comprises the metallic dopant element selected from a group consisting Ni, Co, Fe, CoFe, NiFe, NiCo, NiCu, CoCu, NiAg, CuAg, Cu, Al, Zn, Ag, Ga, In, and combinations thereof.

12. The SOT device of claim 10, wherein each of the dopant element lamellae layers comprises the non-metallic dopant element selected from a group consisting Si, P, Ge, and combinations thereof.

13. The SOT device of claim 10, wherein the BiSbE alloy layer further comprises the one or more dopant element lamellae layers at a top edge of the BiSbE alloy layer.

14. The SOT device of claim 10, wherein the BiSbE alloy layer further comprises the one or more dopant element lamellae layers modulated in the BiSbE alloy layer.

15. A SOT MRAM device, comprising the SOT device of claim 10, wherein the BiSbE alloy layer is a spin orbit material electrode proximate to a free perpendicular magnetic anisotropy ferromagnetic layer.

16. A SOT-based energy-assisted magnetic recording (EAMR) write heads, comprising the SOT device of claim 10, wherein the BiSbE alloy layer is proximate to a spin-torque layer.

17. The SOT device of claim 10, wherein the BiSbE alloy layer comprises $Bi_{1-x}Sb_xE$ wherein x is 0.05<x<0.22.

18. A magnetoresistive random access memory (MRAM) device, comprising:
    a bismuth antimony dopant element (BiSbE) alloy layer, the BiSbE alloy layer having a (012) orientation, the BiSbE alloy layer comprising,
    bismuth;
    antimony; and
    one or more metallic dopant element lamellae layers throughout the BiSbE alloy layer, each of the one or more metallic dopant element lamellae layers comprising a metallic dopant element selected from a group consisting of Ni, Co, Fe, CoFe, NiFe, NiCo, NiCu, CoCu, NiAg, CuAg, Cu, Al, Zn, Ag, Ga, In, and combinations thereof; and
    a perpendicular magnetic anisotropy (PMA) ferromagnetic layer.

19. The MRAM device of claim 18, wherein the BiSbE alloy layer comprises:
    a plurality of BiSb lamellae layers comprising the bismuth and the antimony.

20. The MRAM device of claim 19, wherein the BiSbE alloy layer comprises the one or more metallic dopant element lamellae layers at least at a bottom edge of the BiSbE alloy layer.

21. The MRAM device of claim 18, wherein the PMA ferromagnetic layer is an annealed PMA ferromagnetic layer.

22. The MRAM device of claim 18, wherein the BiSbE alloy layer has a roughness ($R_a$) of 14 Å or less after the PMA ferromagnetic layer is annealed.

23. The MRAM device of claim 18, wherein the BiSbE alloy layer has a rocking curve of 11 degrees or less.

24. The MRAM device of claim 18, wherein the BiSbE alloy layer is a topological insulator after the PMA ferromagnetic layer is annealed.

* * * * *